US010386430B2

(12) United States Patent
Yang et al.

(10) Patent No.: US 10,386,430 B2
(45) Date of Patent: Aug. 20, 2019

(54) SINGLE LAYER MAGNETIC RESONANCE IMAGING TRANSMIT/RECEIVE RADIO FREQUENCY COIL

(71) Applicant: Quality Electrodynamics, LLC, Mayfield Village, OH (US)

(72) Inventors: Xiaoyu Yang, Indiana, PA (US); Haoqin Zhu, Mayfield Village, OH (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 130 days.

(21) Appl. No.: 15/583,345

(22) Filed: May 1, 2017

(65) Prior Publication Data
US 2018/0081005 A1    Mar. 22, 2018

Related U.S. Application Data

(60) Provisional application No. 62/397,545, filed on Sep. 21, 2016, provisional application No. 62/464,720, (Continued)

(51) Int. Cl.
*G01V 3/00* (2006.01)
*G01R 33/36* (2006.01)
(Continued)

(52) U.S. Cl.
CPC ... *G01R 33/3628* (2013.01); *G01R 33/34076* (2013.01); *G01R 33/3614* (2013.01);
(Continued)

(58) Field of Classification Search
USPC ........................................................ 324/322
See application file for complete search history.

(56) References Cited

U.S. PATENT DOCUMENTS 4,680,549 A    7/1987 Tanttu
4,825,162 A    4/1989 Roemer et al.
(Continued)

FOREIGN PATENT DOCUMENTS

WO    20150043612 A1    4/2015

OTHER PUBLICATIONS

W. Wang, et al., "Inductive Coupled Local TX Coil Design", Proc. Intl. Soc. Mag. Reson. Med. 18 (2010).
(Continued)

*Primary Examiner* — Rodney E Fuller
(74) *Attorney, Agent, or Firm* — Eschweiler & Potashnik, LLC

(57) ABSTRACT

A magnetic resonance imaging (MRI) radio frequency (RF) coil array configured to operate in a transmit (Tx) mode or in a receive (Rx) mode, the MRI RF coil array comprising at least one single-layer RF coil element. The at least one RF coil element includes a resonant LC coil, a matching Tx/Rx switch circuit, and a preamplifier. The matching and Tx/Rx switch circuit, when operating in Tx mode, electrically isolates the LC coil from the preamplifier upon the LC coil resonating with a primary coil at the primary coil's working frequency. The LC coil, upon resonating with the primary coil at the working frequency, generates a local amplified Tx field based on an induced current in the LC coil. A magnitude or a phase of the induced current is independently adjustable. The matching and Tx/Rx switch circuit, when in Rx mode, electrically connects the LC coil with the preamplifier.

32 Claims, 15 Drawing Sheets

Related U.S. Application Data filed on Feb. 28, 2017, provisional application No. 62/476,073, filed on Mar. 24, 2017.

(51) Int. Cl.
   *G01R 33/34* (2006.01)
   *G01R 33/28* (2006.01)
   *G01R 33/341* (2006.01)
   *G01R 33/3415* (2006.01)

(52) U.S. Cl.
   CPC ..... *G01R 33/3642* (2013.01); *G01R 33/3657* (2013.01); *G01R 33/3664* (2013.01); *G01R 33/288* (2013.01); *G01R 33/341* (2013.01); *G01R 33/3415* (2013.01)

(56) References Cited

U.S. PATENT DOCUMENTS

| | | | |
|---|---|---|---|
| 4,987,370 A | 1/1991 | Leussler et al. | |
| 5,355,087 A | 10/1994 | Claiborne | |
| 5,777,474 A | 7/1998 | Srinivasan | |
| 5,903,150 A | 5/1999 | Roznitsky | |
| 5,910,728 A | 6/1999 | Sodickson | |
| 6,323,648 B1 * | 11/2001 | Belt | G01R 33/3415 324/318 |
| 6,791,328 B1 * | 9/2004 | Nabetani | G01R 33/34076 324/318 |
| 6,982,554 B2 | 1/2006 | Kurpad et al. | |
| 7,180,296 B2 * | 2/2007 | Gross | G01R 33/3657 324/318 |
| 2002/0169374 A1 | 11/2002 | Jevtic | |
| 2017/0146622 A1 | 5/2017 | Yang et al. | |
| 2018/0081008 A1 * | 3/2018 | Yang | A61B 5/055 |
| 2018/0275226 A1 * | 9/2018 | Yang | G01R 33/288 |
| 2018/0275233 A1 * | 9/2018 | Yang | G01R 33/3628 |
| 2018/0313918 A1 * | 11/2018 | Yang | G01R 33/3628 |

OTHER PUBLICATIONS

Wang J., "A Novel Method to Reduce the Signal Coupling of Surface Coils for MRI", Proc. ISMRM 4:1434 (1996).
Jovan Jevtic, "Ladder Networks for Capacitive Decoupling in Phased-Array Coils", Proc. Intl. Soc. Mag. Reson. Med 9 (2001).
Klaas P. Pruessmann et al, "SENSE: Sensitivity Encoding for Fast MRI", Magnetic Resonance in Medicine 42:952-962 (1999).
Ulrich Katscher et al, "Transmit SENSE", Magnetic Resonance in Medicine 49:144-150 (2003).
U.S. Appl. No. 16/009,546, filed Jun. 15, 2018.
U.S. Appl. No. 15/706,005, filed Sep. 15, 2017.
U.S. Appl. No. 15/933,860, filed Mar. 23, 2018.
U.S. Appl. No. 15/923,437, filed Mar. 16, 2018.
U.S. Appl. No. 15/964,390, filed Apr. 27, 2018.
U.S. Appl. No. 15/971,075, filed May 4, 2018.
International Search Report and Written Opinion dated Nov. 9, 2017 in connection with International Patent Application No. PCT/US2017/042590.

* cited by examiner

SINGLE LAYER MAGNETIC RESONANCE IMAGING TRANSMIT/RECEIVE RADIO FREQUENCY COIL

RELATED APPLICATIONS

This application claims priority to and the benefit of U.S. Provisional Patent Application 62/397,545 filed Sep. 21, 2016, U.S. Provisional Patent Application 62/464,720 filed Feb. 28, 2017, and U.S. Provisional Patent Application 62/476,073, filed Mar. 24, 2017.

BACKGROUND

A magnetic resonance imaging (MRI) system may include two kinds of MRI radio frequency (RF) coils. The first kind of MRI RF coil is a transmit (Tx) coil. A Tx coil, while operating in Tx mode, transmits high power RF energy into the anatomy of the subject being imaged to excite nuclei spins in the tissue being imaged. The second kind of MRI RF coil is a receive (Rx) coil. An Rx coil, while operating in Rx mode, detects weak signals from nuclei spins of the anatomy being imaged. A conventional MRI system uses a built-in whole body coil (WBC) as a Tx coil. In a conventional MRI system, due to the geometric size of the WBC, the WBC applies RF energy to a much larger region of tissue than is required to image a given region of interest. For example, when a head scan is performed and a WBC is used, not only the head, but also the shoulders and chest also receive a high level of RF energy. This creates a high level specific absorption rate (SAR) issue which limits the clinical utility of MRI systems that use a conventional WBC/Rx coil approach. As a result, a local Tx coil is frequently used to mitigate the SAR problem.

A local Tx coil is designed to apply RF energy into only the anatomy being imaged. There are two conventional approaches to transmitting energy from a power source to a local Tx coil. A first conventional approach is to use a direct connection between the power source to the Tx coil using wires. The Direct connection using wires is energy efficient because the energy loss in the connection wires is trivial. A disadvantage of direct connection using wires is that dedicated wiring is required, which increases the cost and complexity of the coil.

A second conventional approach to transmitting energy from a power source to a local Tx coil is to use inductive coupling. For the inductive coupling approach, a primary coil is used to directly connect to a power source. The primary coil may be a WBC or another large coil. The primary coil is a resonant LC circuit. A second coil is also used. The second coil is another resonant circuit and is inductively coupled to the primary coil. Thus, energy can be transferred from the primary coil to the second coil. The second coil can be used to excite nearby anatomy more efficiently than the WBC because the second coil is smaller and closer to the nearby anatomy than the WBC. Compared to the first approach using a direct connection with wires, the inductive coupling approach may be less efficient than direct wiring but is still more efficient than a conventional WBC. One benefit of the inductive coupling approach is that no special wiring is required. However, conventional inductive coupling approaches require the use of multiple coils. For example, a conventional inductively coupled knee coil uses two layers of RF coils. The first (inner) layer includes a plurality of Rx coil elements which detect signals from the anatomy while operating in Rx mode, and which are decoupled from the transmitting field while operating in Tx mode. The second (outer) layer is a standard birdcage coil which inductively couples to a WBC to create a local amplified transmitting field in Tx mode and which is disabled in Rx mode. However, this conventional inductively coupled dual layer coil has drawbacks. For example, all the individual Rx coil elements in a conventional dual layer coil need associated circuits for decoupling the Rx coil and the local Tx coil while operating in Tx mode. Conventional inductively coupled dual layer coils also require circuits for switching off the Tx coil while operating in Rx mode, which require complex and expensive control circuits. This leads to complex and expensive coils. These multiple decoupling circuits and complex control circuits can also decrease the signal to noise ratio (SNR), thereby reducing image quality. Furthermore, the outer layer, by its proximity to the inner layer, will create additional noise when the inner layer is operating in Rx mode.

DETAILED DESCRIPTION

Figure 1:
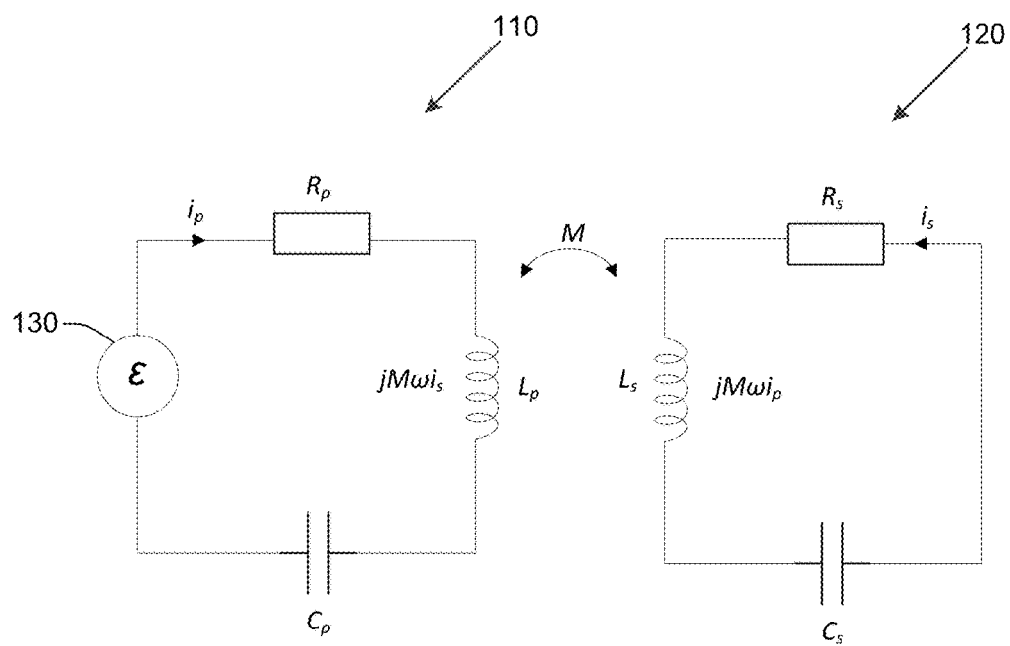
FIG. 1 illustrates inductively coupled resonant RF coils.

FIG. 1 illustrates an RF coil 110 and an RF coil 120. Coil 110 and coil 120 are resonant RF coils and are inductively coupled to each other. Coil 110 and coil 120 may be part of an MRI system. In this example, coil 110 operates as a primary coil and is driven by RF amplifier ε 130. Coil 120 operates as a secondary coil. Secondary coil 120 is inductively coupled to the primary coil 110 by mutual inductance M. Secondary coil 120 is driven by the mutual inductively coupled RF power from the primary coil 110. The primary coil 110 is, in this example, a WBC, while the secondary coil 120 is a local inductively coupled smaller coil. For the primary coil 110, $R_p$, $C_p$, and $L_p$ are defined as the coil loss resistance, the equivalent coil breaking point capacitance, and the equivalent total coil inductance respectively. The RF amplifier ε 130 is defined as an equivalent RF voltage source from an RF power amplifier through a matching circuit, which is not illustrated for clarity. The resistive loss from the RF amplifier ε 130 is absorbed by $R_p$, which may be pre-defined for simplicity of calculation. The mutual inductance between primary coil 110 and secondary coil 120 is defined as M. The resistive loss, the equivalent breaking point capacitance, and the total inductance of secondary RF coil 120 are defined as $R_s$, $C_s$, and $L_s$ respectively. The RF current through primary coil 110 is defined as $i_p$, and the RF current through secondary coil 120 is defined as $i_s$. Mutual inductance between primary RF coil 110 (e.g. $L_p$) and secondary RF coil 120 (e.g. $L_s$) generates an induced voltage on primary coil 110 $L_p$, which may be expressed as $+/-j\omega M i_s$. The sign of $j\omega M i_s$ is determined by the polarity between primary coil 110 $L_p$ and secondary coil 120 $L_s$. For clarity of exposition, the positive sign is used in this example. Similarly, the mutual inductance between secondary coil 120 $L_s$ and primary coil 110 $L_p$ generates an induced voltage on secondary coil 120 $L_s$, which may be expressed as $+/-j\omega M i_p$. The sign is the same for both primary coil 110 and secondary coil 120.

Using Kirchhoff's law, primary coil 110 and secondary coil 120 represented in FIG. 1 may be described by equation 1 below:

for primary coil 110: $Z_p i_p + j\omega M i_s = \varepsilon$ for secondary coil 120: $j\omega M i_p + Z_s i_s = 0$ (Eq. 1), where $$Z_p = R_p + j\left(\omega L_p - \frac{1}{\omega C_p}\right) \text{ and}$$

$$Z_s = R_s + j\left(\omega L_s - \frac{1}{\omega C_s}\right),$$

where Z represents impedance.

Equation 1 may be re-written in matrix format, resulting in:

$$\begin{pmatrix} Z_p & j\omega M \\ j\omega M & Z_s \end{pmatrix} \begin{pmatrix} i_p \\ i_s \end{pmatrix} = \begin{pmatrix} \varepsilon \\ 0 \end{pmatrix}$$ (Eq. 2)

Thus, the solution to equation 2 is:

$$\begin{pmatrix} i_p \\ i_s \end{pmatrix} = \frac{1}{Z_p Z_s + \omega^2 M^2} \begin{pmatrix} Z_s \varepsilon \\ -j\omega M \varepsilon \end{pmatrix} \text{ where}$$ (Eq. 3)

$$i_p = \frac{Z_s \varepsilon}{(Z_p Z_s + \omega^2 M^2)} \text{ and } i_s = \frac{-j\omega M \varepsilon}{(Z_p Z_s + \omega^2 M^2)}.$$

If both the primary coil 110 and the secondary coil 120 resonate at the same frequency, then $Z_p = R_p$ and $Z_s = R_s$. Thus $$i_p = \frac{R_s \varepsilon}{(R_p R_s + \omega^2 M^2)} \text{ and } i_s = \frac{-j\omega M \varepsilon}{(R_p R_s + \omega^2 M^2)}.$$

Recall that the phase of $i_s$ is opposite to the phase of $i_p$, per Lenz's Law. The ratio between $i_s$ and $i_p$ is $-j\omega M/R_s$. The secondary coil 120's quality factor (Q) may be high, i.e., the value of $R_s$ may be small. Therefore the ratio between current $i_s$ and $i_p$ may be large. Furthermore, because secondary coil 120 is much smaller than primary coil 110 and is also closer to the imaging area than primary coil 110, the same magnitude of RF current generates a larger magnetic transmitting field at the area being imaged. Thus, a local inductive coil is significantly more power efficient than a large WBC coil and the local inductive coil's current is dominant compared to the primary coil's current even though their phases are opposite to each other. Furthermore, if a local inductive coil such as secondary coil 120 does not resonate at the frequency of primary coil 110, then the induced current $i_s$ in secondary coil 120 can be written as:

$$i_s = \frac{-j\omega M \varepsilon}{\left(R_p R_s + \omega^2 M^2 + jR_p\left(\omega L_s - \frac{1}{\omega C_s}\right)\right)}$$ (Eq. 4)

As shown in Eq. 4, the frequency deviation of secondary coil 120 from primary coil 110 can reduce the magnitude of $i_s$ and change the phase of $i_s$. This approach may be used by embodiments described herein to reduce the local inductive coil 120's RF power efficiency if a particular MRI application requires it. For example, as demonstrated by Eq. 4, the induced current $i_s$ is a function of a coil loss resistance of primary coil 110, a coil loss resistance of secondary coil 120, or a difference between a working frequency of primary coil 110 and a resonant frequency of secondary coil 120. Thus, embodiments described herein may independently adjust a magnitude of the induced current in a local coil (e.g. secondary coil 120), or a phase of the induced current in a local coil (e.g. secondary coil 120) by adjusting the coil loss resistance of the primary coil (e.g. primary coil 110), the coil loss resistance of the secondary coil (e.g. secondary coil 120), or the difference between the working frequency and the resonant frequency. Embodiments described herein may therefore also adjust the magnitude of local Tx field generated by a single layer MRI RF coil operating in Tx mode.

Embodiments described herein include a single-layer MRI RF coil that employs a single-layer approach to achieve a local inductively coupled Tx transmitter from a plurality of Rx receivers. An example single-layer MRI RF coil may operate in a Tx mode or an Rx mode. In Rx mode the single-layer MRI RF coil functions as a plurality of Rx receivers. In Tx mode multiple pin diodes may be used to re-configure all or less than all the plurality of Rx receivers so that either all or less than all of the plurality of Rx receivers may inductively couple to the WBC and amplify the transmit field. Under this single-layer approach there are multiple approaches that may be employed by embodiments described herein to create a Tx field with a local inductively coupled coil.

Figure 2:
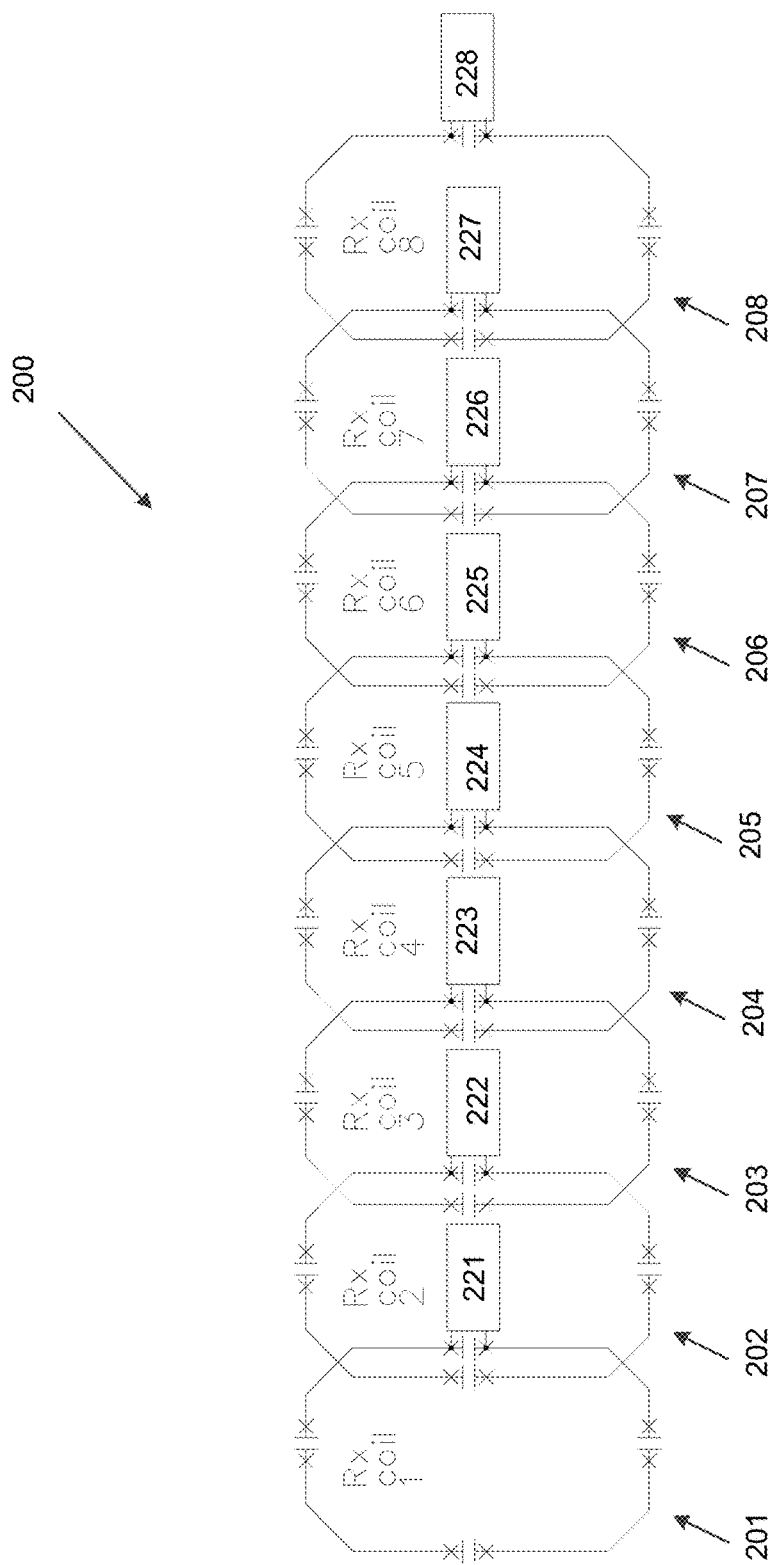
FIG. 2 illustrates a circuit diagram of an eight-rung birdcage coil.

A first single-layer approach is to use PIN diodes to configure Rx coils together to create a local volume coil, such as a birdcage coil, and to inductively couple the local volume coil to a larger WBC. This conventional approach may be demonstrated by an example Rx coil that includes 8 loops configured as independent receivers on a cylindrical former. FIG. 2 is a diagram of an example 8-loop coil 200 in Rx mode. 8-loop coil 200 includes loops 201-208. In this example, a loop is served as an independent receiver, and includes receive electronics 221-228 respectively. Between the directly neighboring loops (e.g. loops 202, 203, 204), the loops overlap each other to achieve good isolation, i.e., minimum mutual inductance. Good isolation between loops can also be achieved by using capacitors.

Figure 3:
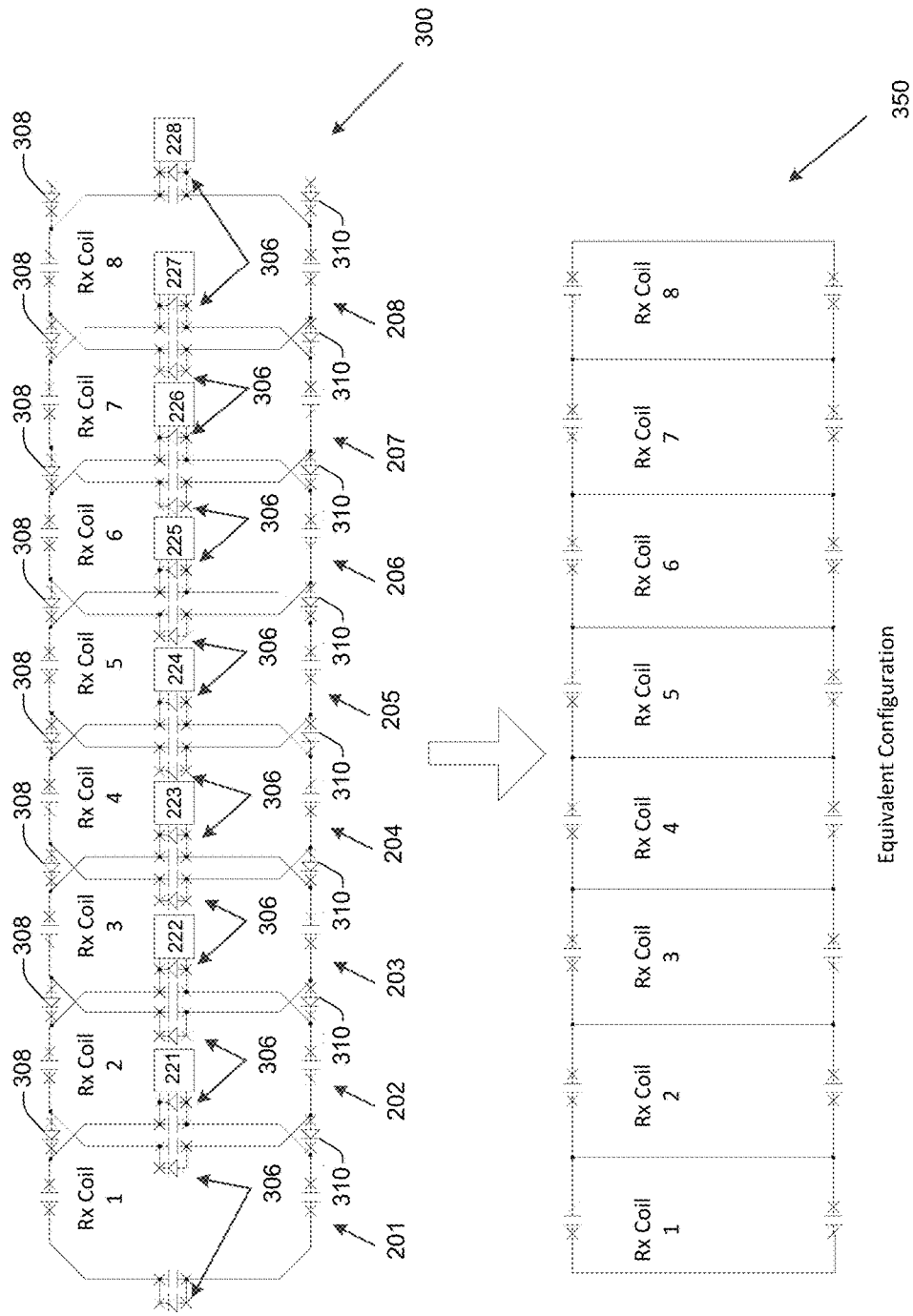
FIG. 3 illustrates a circuit diagram of an eight-rung birdcage coil and equivalent circuit.

FIG. 3 shows an Rx coil 300 similar to Rx coil 200 illustrated in FIG. 2, but with additional elements and details. Rx coil 300 includes multiple PIN diodes 306, 308, and 310. A PIN diode has low impedance (e.g. is shorted) when it is forward biased by a DC power supply. In Tx mode the PIN diodes 306, 308, and 310 are forward biased. The circuitry supporting the PIN diodes 306, 308, and 310, such as RF chokes, is not illustrated in FIG. 3 for clarity. If all PIN diodes 306, 308, and 310 are shorted due to a forward bias, then the circuit of the coil 300 is changed to the equivalent circuit 350. The equivalent circuit 350 illustrates an 8-rung birdcage coil that will inductively couple to a WBC in Tx mode and amplify the transmitting field and increase the efficiency of the WBC. In summary, the first approach of single-layer technology uses PIN diodes to reconfigure all or some of the Rx coil elements in a plurality of Rx coil elements into a local volume coil to increase WBC efficiency using inductive coupling, and to electrically link Rx coil elements together as one larger inductively coupled Tx coil. This conventional approach may be sub-optimal for two reasons. A first reason is that many diodes are required to link different Rx coils together. This increases the complexity of the coils. Therefore, this conventional approach may be expensive. The other reason is that even though PIN diodes are considered to be shorted when a forward bias is applied to the PIN diodes, the resistive losses of the PIN diodes are not really trivial. A typical value of a forward biased PIN diode is 0.5 Ohm. This 0.5 Ohm could be larger than the coil loss itself for some high Q coils. This additional PIN diode resistive loss reduces the local inductively coupled RF coil's power efficiency.

Example embodiments described herein employ a second, different single-layer approach that uses PIN diodes to facilitate switching an Rx coil element into Tx mode so that all or part of all the Rx elements in a plurality of Rx elements can inductively couple to a WBC individually. In this approach, there are no PIN diodes between Rx elements to link the Rx elements together. When forward-biased, a PIN diode may produce a negligible resistance (e.g., $0.1\Omega$), which is essentially a short-circuit. When reverse-biased, a PIN diode may produce a high resistance (e.g., 200 k$\Omega$) in parallel with a low capacitance (e.g., ~2 pF), which is essentially an open-circuit.

An analysis of the induced current in the Rx elements of an array when operating in Tx mode illustrates the operation of the second approach employed by embodiments described herein. In this analysis it is assumed that the couplings among Rx elements are small and can be ignored. The couplings between Rx elements and the WBC are dominant. For example, the WBC field will induce voltage in one element and generate current flow in that element. That current flow will generate its own field. This additional field will induce voltage on this element's neighbors, including direct or indirect neighbors. This additional induced voltage is ignored in this analysis for clarity of exposition because of the assumption that the couplings among Rx elements are small.

Figure 4:
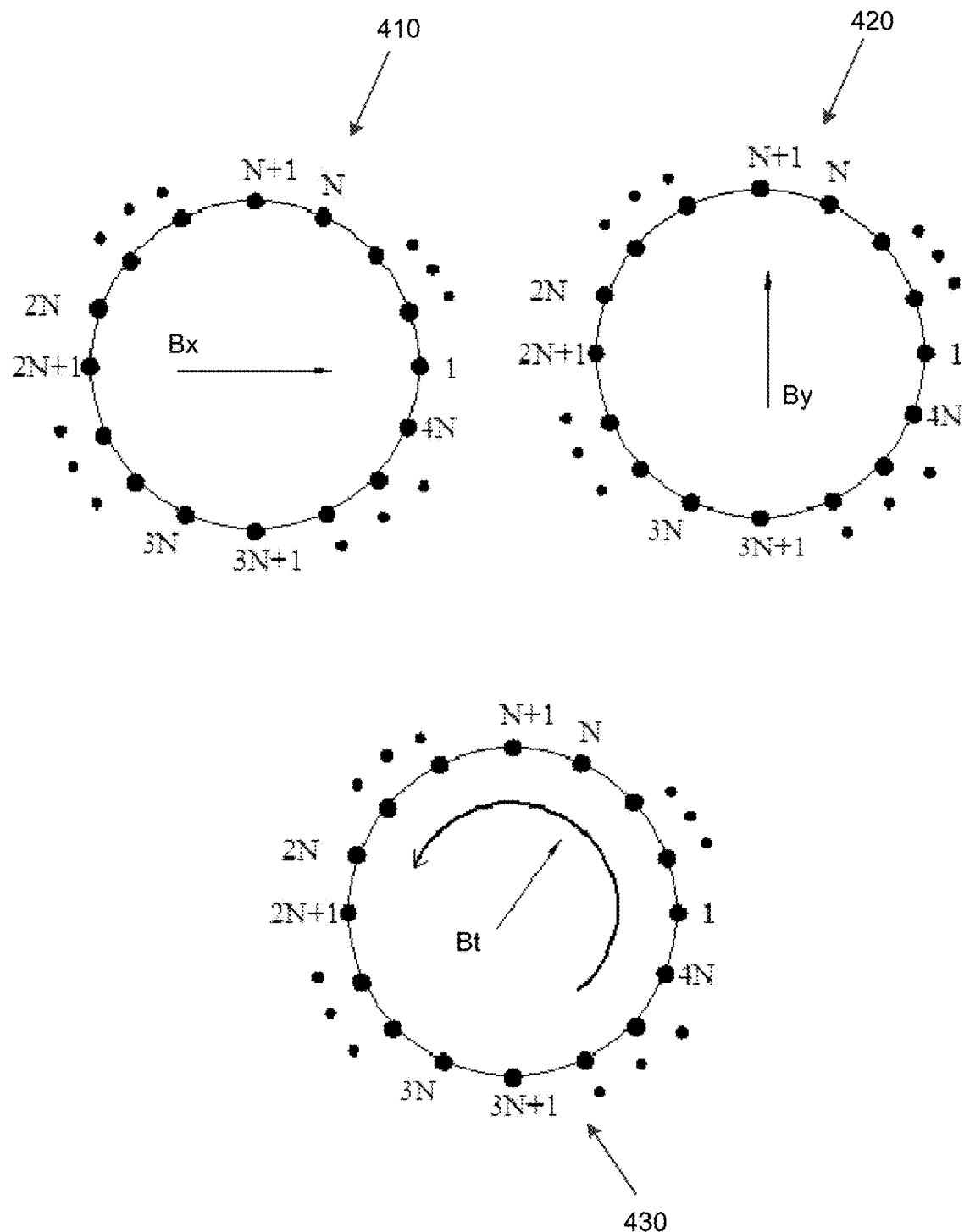
FIG. 4 illustrates current distribution through a birdcage coil.

FIG. 4 illustrates current distribution through rungs of a 4N-rung birdcage coil in circular polarized (CP) mode. Current distribution for a B field in the horizontal direction ($B_x$) is illustrated at 410. For a B field in the horizontal direction ($B_x$) the current through a rung k can be written as:

$$I_{kx} = I_0 \sin\left(\frac{2\pi}{4N}k\right)\sin(\omega_0 t) \quad \text{(Eq. 5)}$$

where k is the rung number (k=1, ..., 4N) and $\omega_0$ is the working frequency.

Current distribution for a B field in the vertical direction ($B_y$) is illustrated at 420. For a B field in the vertical direction ($B_y$) the current through a rung k can be written as $$I_{ky} = \pm I_0 \cos\left(\frac{2\pi}{4N}k\right)\cos(\omega_0 t) \quad \text{(Eq. 6)}$$

For current distribution for a B field in the vertical direction ($B_y$), the time domain function is cosine instead of sine due to the circular polarized mode requirement. Furthermore, the "±" symbol indicates that the direction of $B_y$ may be upward or downward. This affects the rotational direction of the final circular polarized B field, illustrated at 430, by making it rotate either clockwise or counterclockwise. The total current through a rung k is the sum of the two currents described in equation 5 and equation 6. Therefore:

$$I_k = \quad \text{(Eq. 7)}$$
$$I_0 \sin\left(\frac{2\pi}{4N}k\right)\sin(\omega_0 t) \pm I_0 \cos\left(\frac{2\pi}{4N}k\right)\cos(\omega_0 t) = I_0 \cos\left(\omega_0 t \pm \frac{2\pi}{4N}k\right)$$

In this example, a first rung has the same current magnitude $I_0$ and angular frequency $\omega_0$ as another, different rung. The currents in different rungs differ with respect to phase. Thus, a typical high pass, low pass, or bandpass WBC's current distribution in its rungs can be described by Eq. 7.

Figure 13:
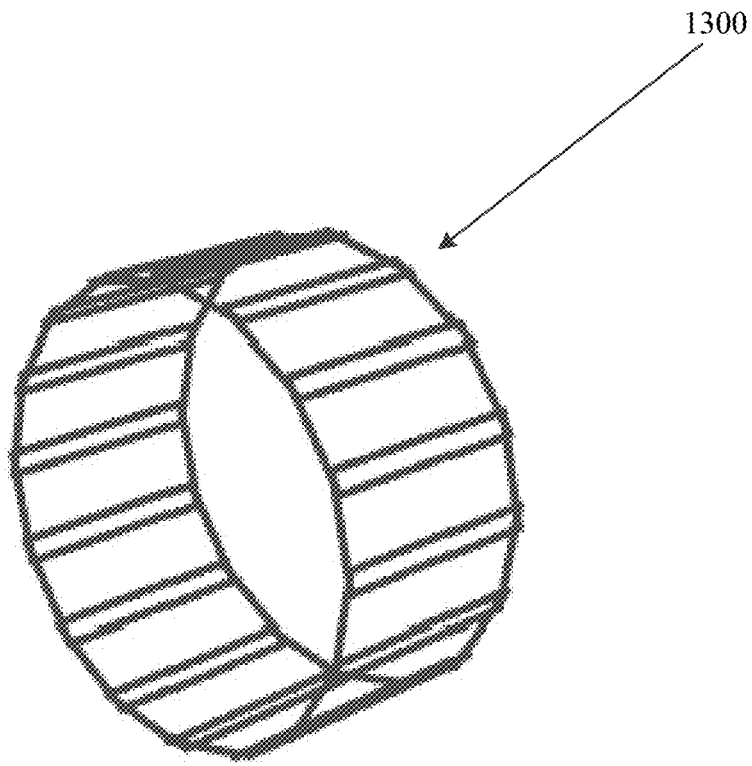
FIG. 13 illustrates an example birdcage coil.

Consider a 4N loops Rx coil that is put inside this circular polarized uniform B field, where the circular polarized uniform B field is generated by a birdcage coil or WBC. FIG. 4, element 430 illustrates current distribution for a B field generated from a birdcage coil or WBC in this situation. In this example, good isolation among all loops is assumed. Furthermore, in this example, each loop is identical, the loops use overlap to isolate the directly neighboring elements, all loops are in the same row, and the loops are wrapped around a cylindrical former. FIG. 13 illustrates an example 16 loop coil 1300 configured as a birdcage coil.

In transmit mode the CP $B_1$ field from a birdcage coil (e.g. a WBC) induces voltage in each loop. The induced voltage for a loop can be written as $$V_{induced} = \frac{d\left(\vec{B_1} \cdot \vec{A_k}\right)}{dt} \quad \text{(Eq. 8)}$$

where $\vec{A_k}$ is the area vector, where the magnitude is the area of the $k_{th}$ loop and the direction is the direction perpendicular to the area towards the outside of the coil.

The $B_1$ field and area vector can be written as $$\vec{B_1} = B_1(\cos(\omega_0 t)\hat{x} + \sin(\omega_0 t)\hat{y}) \quad \text{(Eq. 9)}$$

$$\vec{A_k} = A_0\left(\cos\left(\frac{2\pi}{8N} + (k-1)*\frac{2\pi}{4N}\right)\hat{x} + \sin\left(\frac{2\pi}{8N} + (k-1)*\frac{2\pi}{4N}\right)\hat{y}\right) \quad \text{(Eq. 9a)}$$

where $A_0$ is the area of a loop. Loops in this example have identical dimensions and thus have the same areas. In particular embodiments, loops may have different areas, and calculations may be adjusted accordingly.

Then, equation 8 can be re-written as $$V_{induced} = A_0 B_1 \omega_0 \left(-\sin(\omega_0 t)\cos\left(\frac{2\pi}{8N} + (k-1)*\frac{2\pi}{4N}\right) + \right. \quad \text{(Eq. 10)}$$
$$\left. \cos(\omega_0 t)\sin\left(\frac{2\pi}{8N} + (k-1)*\frac{2\pi}{4N}\right)\right) =$$
$$A_0 B_1 \omega_0 \sin\left(\frac{2\pi}{8N} + (k-1)*\frac{2\pi}{4N} - \omega_0 t\right)$$

Therefore, the current through the equivalent $k_{th}$ rung position is $$I_{induced\_no\_coupling\_k} = \frac{V_k - V_{k-1}}{R} = \frac{A_0 B_1 \omega_0}{R} * 2 * \text{Sin}\left(\frac{2\pi}{8N}\right) * \text{Cos}\left((k-1) * \frac{2\pi}{4N} - \omega_0 t\right) \quad \text{(Eq. 11)}$$

where R is the impedance of a loop. At the resonant frequency the reactive part of the impedance is self-canceled and only the real part is left. As demonstrated by both equation 11 and equation 7, a uniform circular $B_1$ field results. The final $B_1$ field $B_t$ inside the loops is the sum of both. As a result the final $B_1$ field $B_t$ inside a small cylinder may be uniform.

In one embodiment, the isolations between coil elements are very small. If the isolations are not small and the mutual inductance is defined as $M_{kj}$ between the $k_{th}$ and $j_{th}$ elements, and we ignore high order coupling among elements, then:

$$V_{kj} = M_{kj} \frac{d(I_j)}{dt} \quad \text{(Eq. 12)}$$

Therefore, the $k_{th}$ element will see additional coupled voltage from the $j_{th}$ element.

Summing all of the coupled voltages of the $k_{th}$ element results in:

$$V_k = A_0 B_1 \omega_0 \sin\left(\frac{2\pi}{8N} + (k-1) * \frac{2\pi}{4N} - \omega_0 t\right) - \sum_{j=1 \text{ and } j \neq k}^{4N} \left(M_{kj} * A_0 B_1 \omega_0^2 \cos\left(\frac{2\pi}{8N} + (j-1) * \frac{2\pi}{4N} - \omega_0 t\right)\right) \quad \text{(Eq. 13)}$$

Taking the same approach as illustrated in equation 11, then the induced current at the kth rung position can be written as $$I_{induced\_coupled\_k} = \quad \text{(Eq. 14)}$$

$$I_{induced\_no\_coupling\_k} - \sum_{j=1 \text{ and } j \neq k \text{ or } j \neq k-1}^{4N} \left((M_{kj} - M_{(k-1)j}) * A_0 B_1 \omega_0^2 \cos\left(\frac{2\pi}{8N} + (j-1) * \frac{2\pi}{4N} - \omega_0 t\right)\right)/R$$

As demonstrated by equation 14 above, the second term in the right side of equation 14 still creates a uniform $B_1$ field. Therefore, compared to the no-coupled case described in equation 11, the coupled case still creates a uniform $B_1$ field. The difference here is that the couplings create the coupled $B_1$ field which makes the whole coil array less power efficient than the no-coupled case. However, as long as this uniform coupled field is still more efficient than the primary coil, (i.e., the WBC) the coil elements may still be used to resonate to improve RF power efficiency and reduce SAR.

Figure 5:
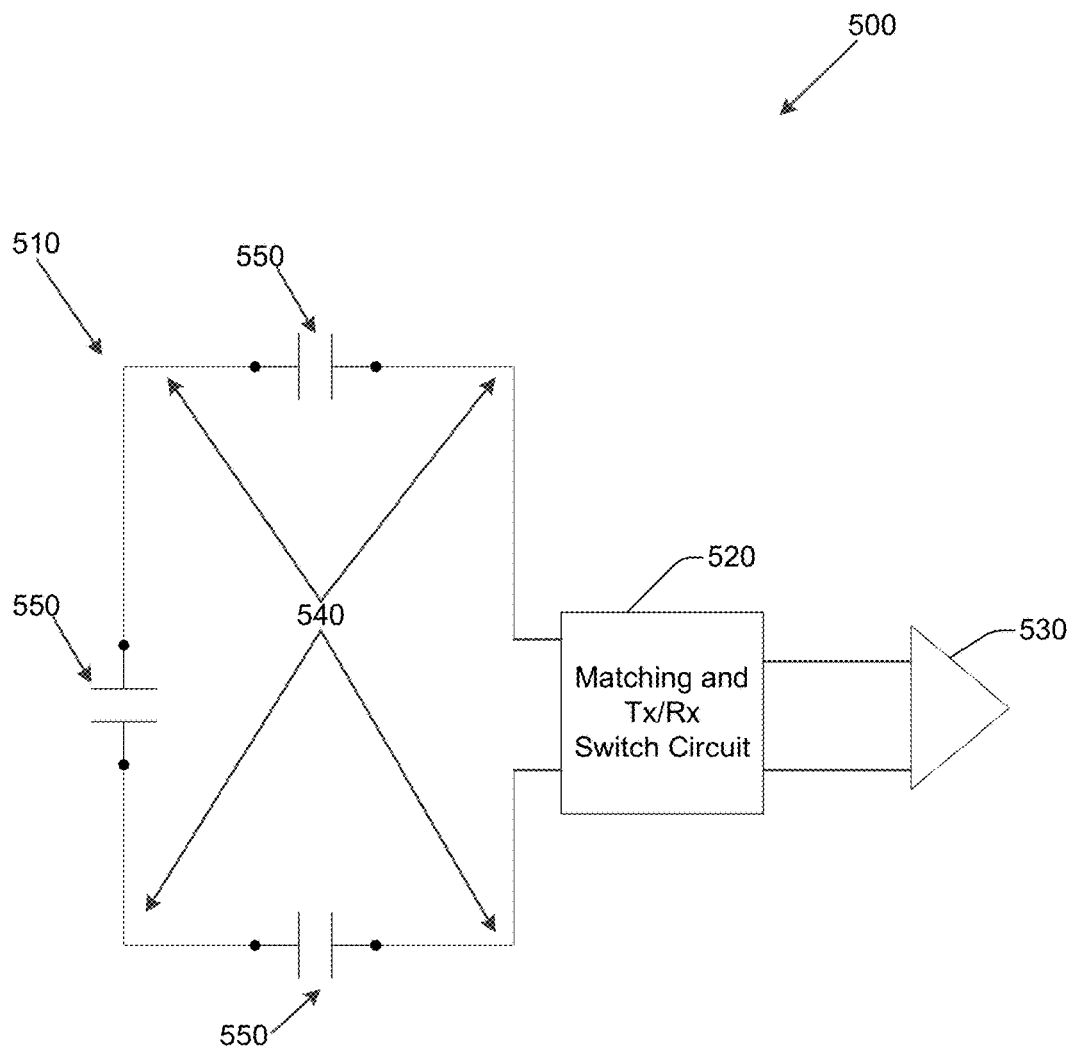
FIG. 5 illustrates an example single-layer MRI RF coil.

FIG. 5 illustrates an example embodiment of an MRI RF coil element 500 that may be part of a single-layer MRI RF coil array. MRI RF coil element 500 employs the second approach to generate a local Tx field. In FIG. 5, the configuration illustrated includes one Rx element only, for clarity. The second approach is simpler than the first approach because fewer PIN diodes are required to switch between Tx mode and Rx mode. Example embodiments thus improve on conventional approaches by saving space within the bore of an MRI apparatus because less hardware is used to construct example embodiments, by avoiding electromagnetic (EM) interference that may be caused by unnecessary hardware, and by reducing manufacturing costs by requiring less hardware, including PIN diodes, than conventional approaches. Example embodiments therefore offer at least one measurable improvement on conventional approaches in addition to providing improved SNR and more uniform fields.

FIG. 5 illustrates an MRI RF coil element 500 configured to operate in a transmit (Tx) mode or in a receive (Rx) mode. MRI RF coil element 500 may be part of a single-layer MRI RF coil array. The single-layer MRI RF coil array comprises at least one RF coil element 500. The MRI RF coil array may be arranged in a closed-shape configuration (e.g. a birdcage coil), or arranged in an open-shape configuration (e.g. in a "C" or "U" shape). In one embodiment, the single-layer MRI RF coil array may be a birdcage coil array. FIG. 13 illustrates an example birdcage coil array 1300. Birdcage coil array 1300 is an eight loop, single-row coil array comprising eight MRI RF coils. A member of the eight MRI RF coils may be, for example, MRI RF coil element 500. In another embodiment, an element of the single-layer MRI RF coil array is configured in a saddle-like configuration. In another embodiment, a first element of the single-layer MRI RF coil array is configured in a saddle-like configuration, while a second, different element of the single-layer MRI RF coil array is configured as a loop. The at least one RF coil element 500 includes an LC coil 510, a matching and Tx/Rx switch circuit 520, and a preamplifier 530. The LC coil 510 includes at least one inductor 540 and at least one capacitor 550. The at least one inductor 540 and the at least one capacitor 550 resonate at a first frequency (i.e., a resonant frequency). The at least one inductor 540 may be, for example, a co-axial cable, a copper wire, a copper foil soldered to a circuit board, or other conductor.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by Z=R+jX=1/(1/(r+jL$\omega$)+jC$\omega$). Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

The matching and Tx/Rx switch circuit 520, when operating in Tx mode, electrically isolates the LC coil 510 from the preamplifier 530 upon the LC coil 510 resonating with a primary coil (not illustrated) at a working frequency of the primary coil. The matching and Tx/Rx switch circuit 520 electrically isolates the LC coil 510 from the preamplifier 530 by providing a threshold level of impedance between the LC coil 510 and the preamplifier 530. The primary coil may be, for example, a WBC or other primary coil that is larger than RF coil element 500. The LC coil 510, upon resonating with the primary coil at the working frequency, generates a local amplified Tx field based on an induced current in the LC coil 510. The induced current has a magnitude and a phase. The magnitude of the induced current or the phase of the induced current may be independently adjustable. For example, the induced current is a function of at least a coil loss resistance of the WBC, a coil loss resistance of the LC coil 510, or a difference between a working frequency of the WBC and a resonant frequency of the LC coil 510. In this embodiment, the frequency of the induced current is the same as the working frequency of the current in the primary coil or WBC, even though the resonant frequency of the LC coil 510 may be different. Embodiments described herein may facilitate adjusting the coil loss resistance of the WBC, the coil loss resistance of the LC coil 510, or the difference between the working frequency of the WBC and the resonant frequency of the LC coil 510. The magnitude of the induced current or the phase of the induced current are configured to be varied over a range of magnitudes or phases respectively. Example embodiments thus facilitate independently adjusting the magnitude of an induced current in LC coil 510, or a phase of the induced current.

Matching and Tx/Rx switch circuit 520, when operating in Rx mode, electrically connects the LC coil 510 with the preamplifier 530 by providing low impedance between the LC coil 510 and the preamplifier 530. Preamplifier 530 may be a low input impedance low noise amplifier (LNA). In one embodiment, matching and Tx/Rx switch circuit 520 may be a capacitive matching and Tx/Rx switch circuit. In another embodiment, matching and Tx/Rx switch circuit 520 may be an inductive matching and Tx/Rx switch circuit.

Figure 15:
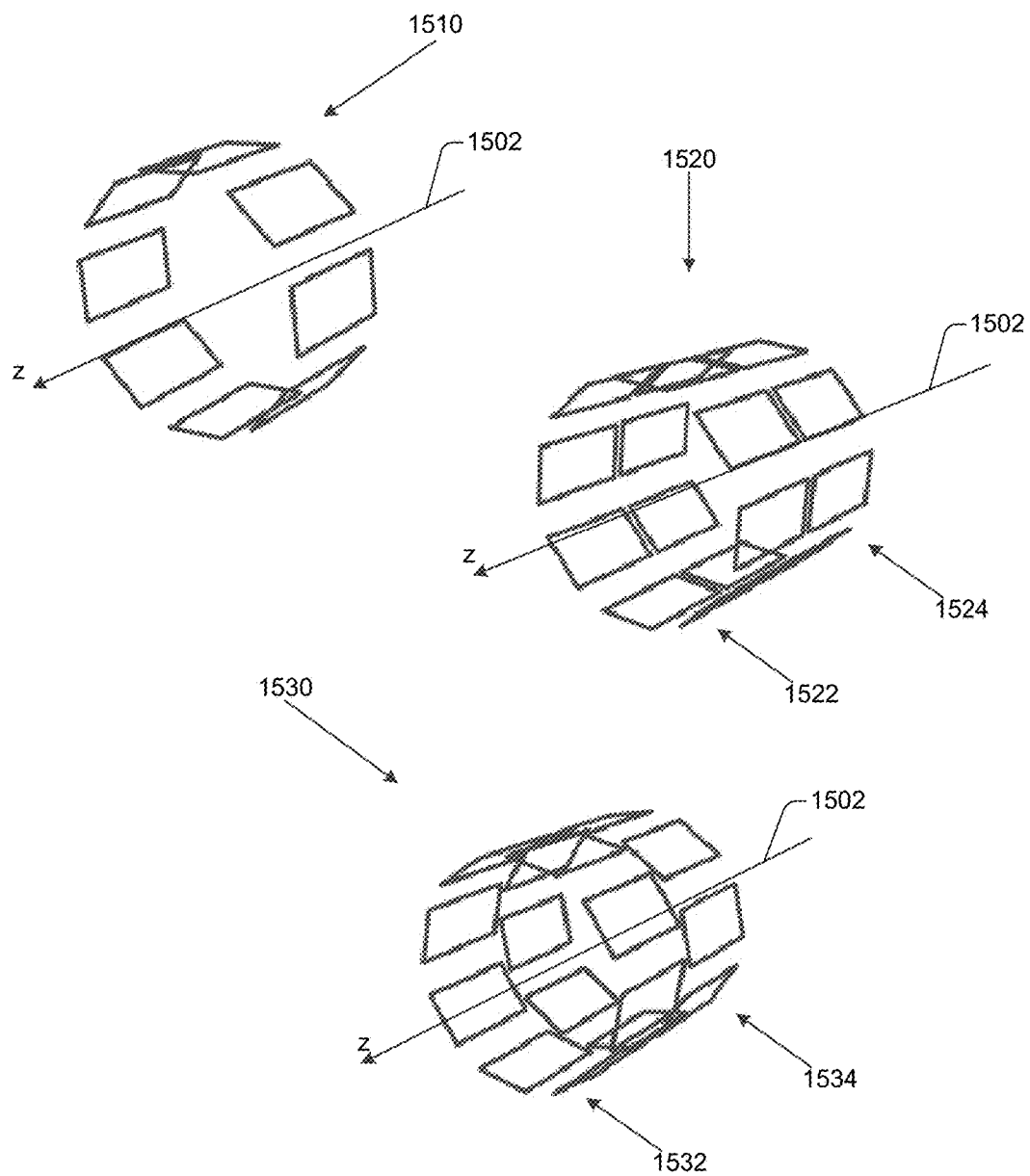
FIG. 15 illustrates example single-layer MRI RF coil arrays.

Example MRI RF coil elements, MRI RF coil arrays, MRI RF coils, apparatus, and other embodiments, may be configured, for example, as bird cage coils. FIG. 15 illustrates one embodiment of a single-layer MRI RF coil array 1510 that includes at least one MRI RF coil elements arranged in a single-row birdcage configuration. The at least one MRI RF coil elements may include MRI RF coil elements 500, 600, 700, 800, 900, or 1400. FIG. 15 also illustrates an example embodiment of a single-layer MRI RF coil array 1520 that includes at least one example MRI RF coil elements arranged in a two-row configuration. Single-layer MRI RF coil array 1520 includes a first row 1522 aligned with a second row 1524. First row 1522 includes at least four RF coil elements. Second row 1524 includes at least four RF coil elements. FIG. 15 further illustrates another, single-layer MRI RF coil array 1530. Single layer MRI coil array 1530 is similar to single-layer MRI RF coil array 1520, except the first row 1532 is not aligned with second row 1534. For example, first row 1532 may be rotated a number of degrees around a central axis (e.g. z axis) shared with second row 1534, while 1534 is not rotated, or is rotated a different number of degrees. In different embodiments, first row 1532 may be aligned to within a threshold level of alignment with second row 1534.

In one embodiment, MRI RF coil array 1520 includes a first plurality of RF coil elements (e.g. first row 1522) and a second plurality of RF coil elements (e.g. second row 1524). The first plurality of RF coil elements and the second plurality of RF coil elements are radially disposed about a longitudinal axis 1502. The first plurality and the second plurality may be longitudinally offset a threshold distance greater than zero along the longitudinal axis 1502. In one embodiment, an element of the first plurality of RF coil elements is axially offset a threshold amount from a respective element of the second plurality of RF coil elements. For example, an element of the first plurality of RF coil elements may be axially offset 15 degrees, 30 degrees, or another, different number of degrees, from a respective element of the second plurality of RF coil elements. The first plurality and the second plurality may include the same number of RF coil elements, or may include different numbers of RF coil elements. For example, in one embodiment, the first plurality may include eight RF coil elements, while the second plurality may include nine RF coil elements. Other, different numbers of RF coil elements may be employed.

In another embodiment, the at least one RF coil elements is arranged in a three-row configuration. For example, a three-row single layer MRI RF coil array may include a first row that includes at least five RF coil elements, a second row that includes at least five RF coil elements, and a third row that includes at least five RF coil elements. In this embodiment, the first row, second row, and third row may be aligned axially, or may be unaligned axially. In another embodiment, other different numbers of rows, number of RF coil elements, or combinations of alignments may be employed.

For example, in one embodiment, MRI RF coil array 1520 includes a first plurality of RF coil elements 1522, a second plurality of RF coil elements 1524, and a third plurality of RF coil elements (not illustrated). In this embodiment, the first plurality of RF coil elements 1522, the second plurality of RF coil elements 1524, and the third plurality of RF coil elements are radially disposed about a longitudinal axis. The first plurality 1522, the second plurality 1524, and the third plurality are longitudinally offset a threshold amount along the longitudinal axis. In one embodiment, an element of the first plurality 1522 of RF coil elements is axially offset a threshold amount from a respective element of the second plurality 1524 of RF coil elements or the third plurality of RF coil elements. The first plurality 1522, the second plurality 1524, and the third plurality may include the same number of RF coil elements, or may include different numbers of RF coil elements. For example, in one embodiment, the first plurality 1522 may include eight RF coil elements, the second plurality 1524 may include nine RF coil elements, and the third plurality may include seven RF coil elements. In another embodiment, the first plurality 1522, the second plurality 1524, or the third plurality may include other, different numbers of RF coil elements.

Figure 6:
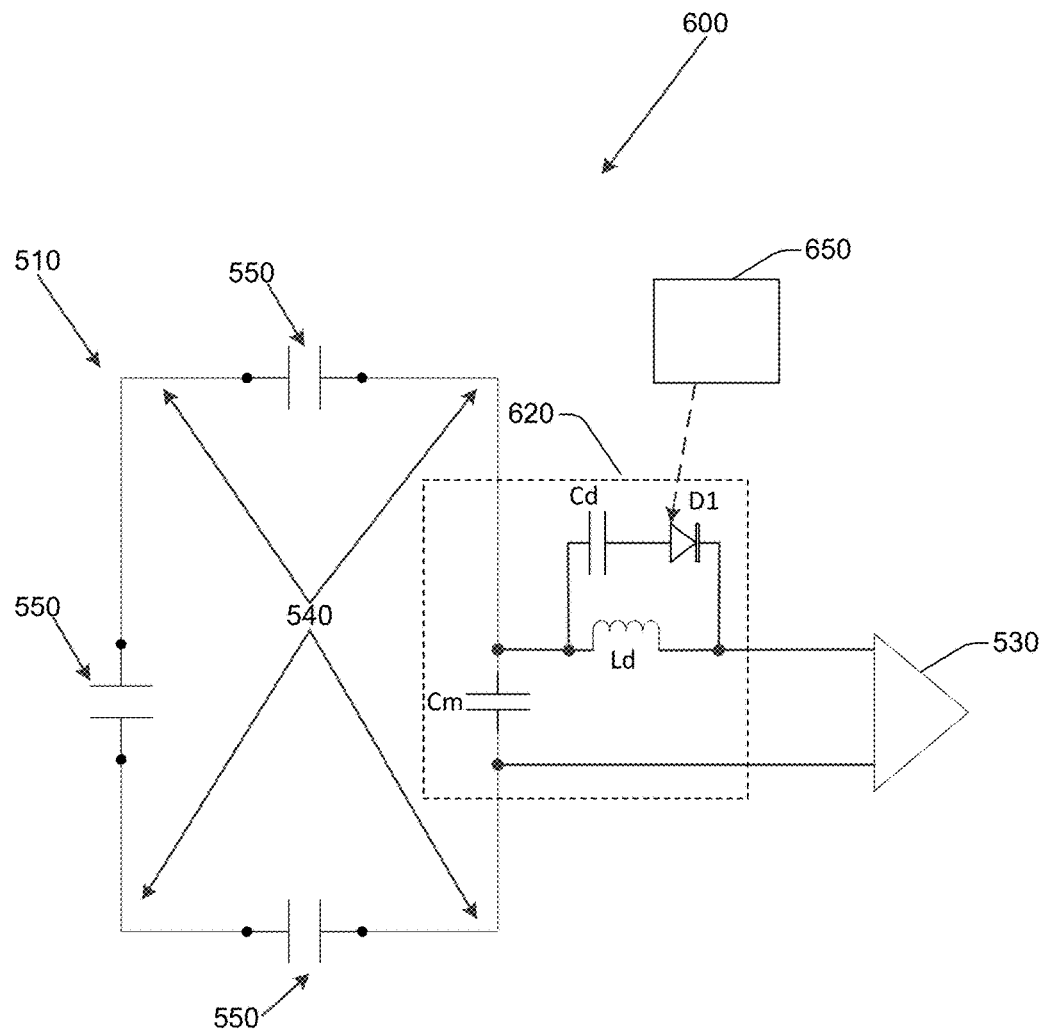
FIG. 6 illustrates an example single-layer MRI RF coil.

FIG. 6 illustrates an MRI RF coil element 600. MRI RF coil element 600 is similar to MRI RF coil element 500, but includes additional elements and details. MRI RF coil element 600 may be part of a single-layer MRI RF coil array. The single-layer MRI RF coil array comprises at least one RF coil element 600. In one embodiment, MRI RF coil element 600 includes a matching and Tx/Rx switch 620 configured to operate as a capacitive matching and Tx/Rx circuit. In this embodiment, matching and Tx/Rx switch 620 includes a matching capacitor Cm, a first diode D1, a capacitor Cd, and a first inductor Ld. First diode D1 may be a PIN diode. The first diode D1, capacitor Cd, and first inductor Ld create a resonant tank circuit in Tx mode when first diode D1 is forward biased. This resonant tank circuit isolates input to the LNA preamplifier 530 from an induced high current or voltage in LC coil 510. The resonant tank circuit further facilitates LC coil 510, including capacitors 550, inductors 540, and matching capacitor Cm, to resonate at a high Q without preamplifier 530 being electrically connected to the RF coil.

In this embodiment, matching capacitor Cm has a first terminal and a second terminal. Matching capacitor Cm is connected, at a first terminal, to a first terminal of first inductor Ld. First inductor Ld is connected at a first terminal, to a capacitor Cd, at a first terminal. Capacitor Cd is connected, at a second terminal, to first diode D1, at a first terminal. First diode D1 is connected, at a second terminal to first inductor Ld, at a second terminal. First inductor Ld is connected, at a second terminal, to a first input terminal of preamplifier 530. Preamplifier 530 is connected, at a second input terminal, to the second terminal of matching capacitor Cm. In Rx mode, first diode D1 is backward biased (i.e, first diode D1 has a high impedance in Rx mode), so that effectively only Ld is presented between Cm and Preamplifier 530. While in this example first inductor Ld, first diode D1, and capacitor Cd are illustrated on a connection path between the first terminal of matching capacitor Cm and a first input terminal of preamplifier 530, in another embodiment, first inductor Ld, first diode D1, and capacitor Cd may be connected instead between the second terminal of matching capacitor Cm and the second input terminal of preamplifier 530.

In one embodiment, MRI RF coil element 600 further includes a PIN diode control circuit 650. PIN diode control circuit 650 facilitates selective control of first diode D1. For example, PIN diode control circuit 650 controls a forward bias applied to first diode D1. PIN diode control circuit 650 may be operably connected to, for example, first diode D1. In another embodiment, PIN diode control circuit 650 facilitates selective control of other, different diodes, including shunt diodes.

Figure 14:
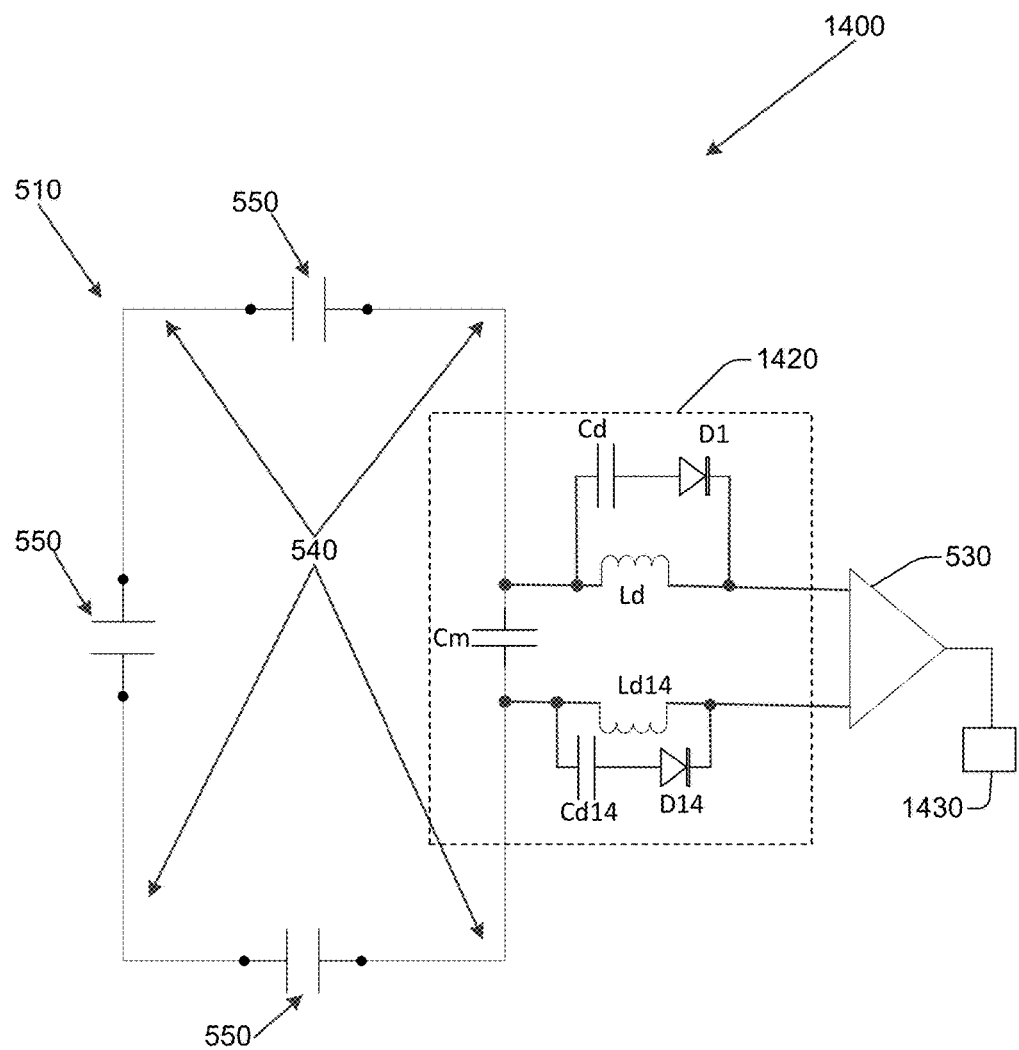
FIG. 14 illustrates an example single-layer MRI RF coil.

FIG. 14 illustrates an MRI RF coil element 1400. MRI RF coil element 1400 is similar to MRI RF coil element 600, but includes additional elements and details. MRI RF coil element 1400 includes matching and Tx/Rx circuit 1420. In this embodiment, matching and Tx/Rx switch 1420 includes matching capacitor Cm, first diode D1, first capacitor Cd, and first inductor Ld. Matching and Tx/Rx switch 1420 also includes second diode D14, second capacitor Cd14, and second inductor Ld14. Second diode D14 may be a PIN diode. The first diode D1, first capacitor Cd first inductor Ld, and second diode D14, second capacitor Cd14, and second inductor Ld14 create a resonant tank circuit in Tx mode when first diode D1 or second diode D14 is forward biased. This resonant tank circuit isolates input to preamplifier 530 from an induced high current or voltage in LC coil 510. The resonant tank circuit further facilitates LC coil 510, including capacitors 550, inductors 540, and matching capacitor Cm, resonating at a high Q without preamplifier 530 being electrically connected to the RF coil.

In this embodiment, matching capacitor Cm has a first terminal and a second terminal. Matching capacitor Cm is connected, at a first terminal, to a first terminal of first inductor Ld. First inductor Ld is attached at a first terminal, to first capacitor Cd, at a first terminal. First capacitor Cd is attached, at a second terminal, to first diode D1, at a first terminal. First diode D1 is attached, at a second terminal to a second terminal of first inductor Ld. First inductor Ld is connected, at a second terminal, to a first input terminal of preamplifier 530. Matching capacitor Cm is connected, at a second terminal, to a first terminal of second inductor Ld14. Second inductor Ld14 is connected, at a first terminal, to second capacitor Cd14, at a first terminal. Second capacitor Cd14 is connected, at a second terminal, to second diode D14, at a first terminal. Second diode D14 is connected, at a second terminal, to a second terminal of second inductor Ld14. Second inductor Ld14 is connected, at a second terminal, to a second input terminal of preamplifier 530.

In one embodiment, MR RF coil element 1400 further includes a balun 1430. In this embodiment, balun 1430 is connected, at a first coaxial or two-connection terminal, to a first coaxial or two-connection output terminal of preamplifier 530. In another embodiment, balun 1430 is connected between matching and Tx/Rx switch 1420 and preamplifier 530. Balun 1430 reduces a common mode current flowing in transmission lines that may connect MRI RF coil element 1400 with an MRI system (not illustrated).

Figure 7:
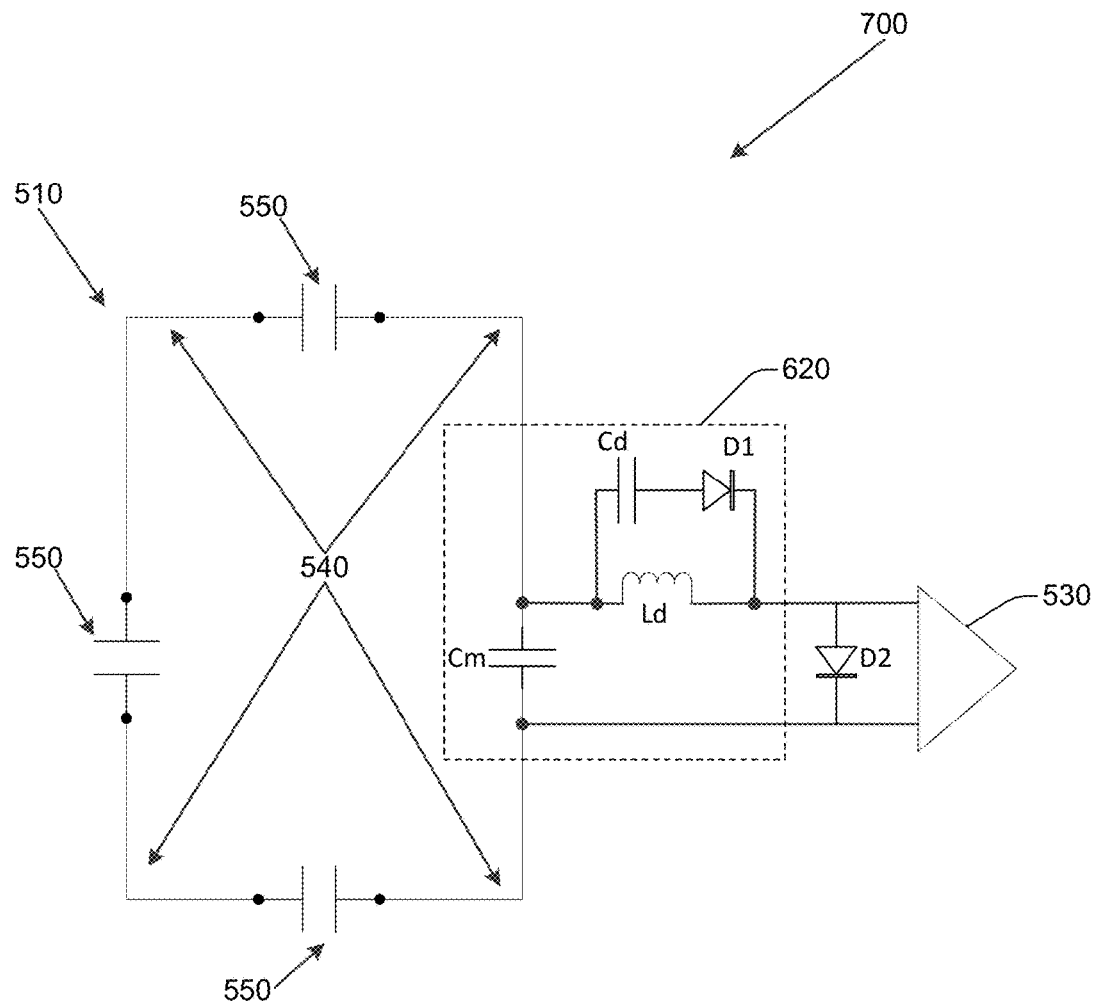
FIG. 7 illustrates an example single-layer MRI RF coil.

FIG. 7 illustrates an MRI RF coil element 700. MRI RF coil element 700 is similar to MRI RF coil element 600, but includes additional elements and details. MRI RF coil element 700 may be part of a single-layer MRI RF coil array. The single-layer MRI RF coil array comprises at least one RF coil element 700. MRI RF coil element 700 includes shunt diode D2. Shunt diode D2 may be a PIN diode. Shunt diode D2 has a first terminal and second terminal. Shunt diode D2 is connected, at a first terminal, to the first input terminal of preamplifier 530. Shunt diode D2 is connected, at a second terminal, to the second input terminal of preamplifier 530. To further improve isolation between high induced current in LC coil 510 and LNA preamplifier 530, shunt diode D2 provides additional shunt protection for the LNA preamplifier 530.

Figure 8:
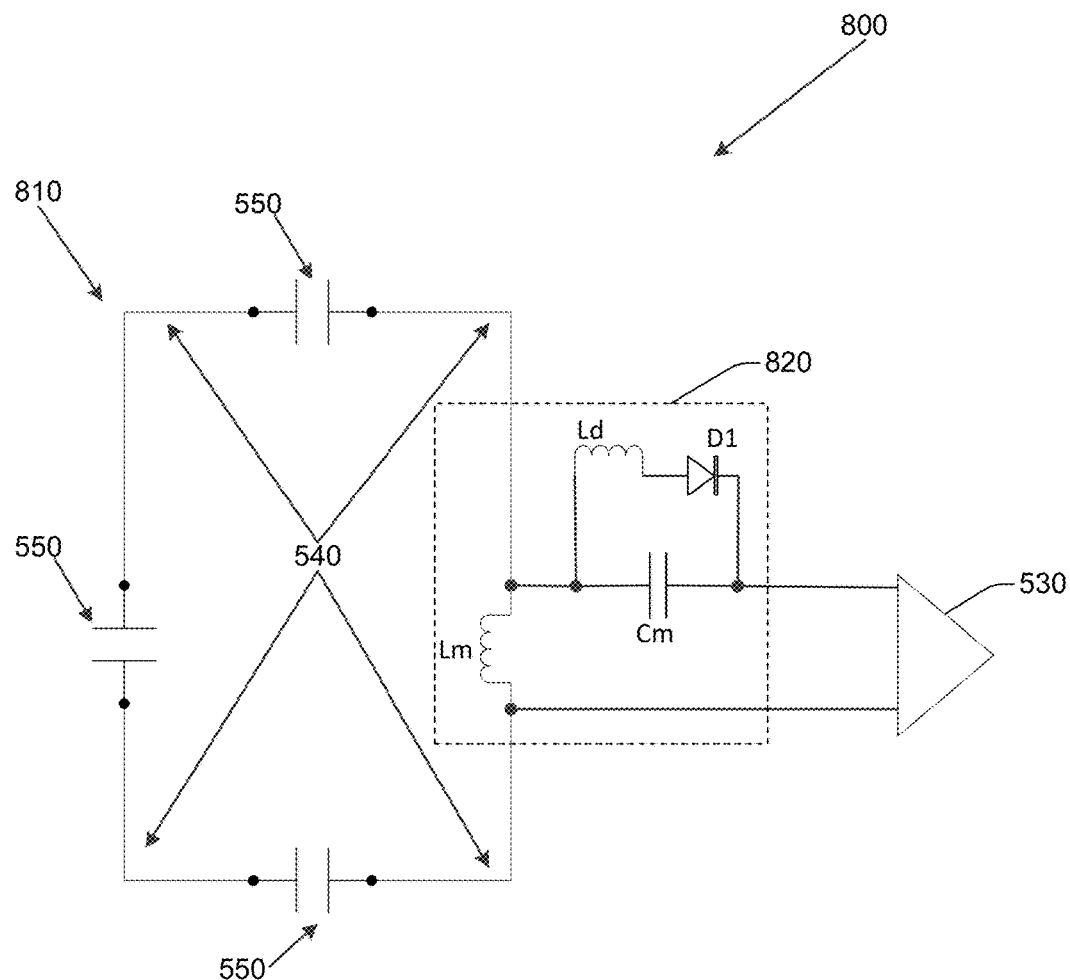
FIG. 8 illustrates an example single-layer MRI RF coil.

FIG. 8 illustrates an MRI RF coil element 800. MRI RF coil element 800 is similar to MRI RF coil element 500, but includes additional elements and details. MRI RF coil element 800 may be part of a single-layer MRI RF coil array. The single-layer MRI RF coil array comprises at least one RF coil element 800. RF coil element 800 includes an LC circuit 810. LC circuit 810 includes a matching inductor Lm having a first terminal and a second terminal. LC circuit 810 also includes at least one conductor 540 having a first end connected to the first terminal of the matching inductor Lm, and a second end connected to the second terminal of the matching inductor Lm. In this embodiment, matching and Tx/Rx switch 820 operates as an inductive matching circuit. Matching and Tx/Rx switch 820 is connected to matching inductor Lm. Matching and Tx/Rx switch 820 includes first inductor Ld having a first terminal and a second terminal, first diode D1 having a first terminal and a second terminal, and matching capacitor Cm having a first terminal and a second terminal. Matching inductor Lm is connected at a first terminal with the first terminal of matching capacitor Cm. Matching capacitor Cm is connected at a first terminal with the first terminal of first inductor Ld. First inductor Ld is connected at a second terminal with the first terminal of first diode D1. First diode D1 is connected at a second terminal with the second terminal of matching capacitor Cm. Matching capacitor Cm is connected at a second terminal with a first input terminal of pre-amplifier 530. Matching inductor Lm is connected, at a second terminal, with a second input terminal of pre-amplifier 530. The first diode D1, matching capacitor Cm, and first inductor Ld isolate input to the preamplifier 530 from an induced high current or voltage in LC coil 510 when first diode D1 is forward biased. While in this example first inductor Ld, first diode D1, and matching capacitor Cm are illustrated on a connection path between the first terminal of matching inductor Lm and a first input terminal of preamplifier 530, in another embodiment, first inductor Ld, first diode D1, and matching capacitor Cm may be connected instead between the second terminal of matching inductor Lm and the second input terminal of preamplifier 530.

Figure 9:
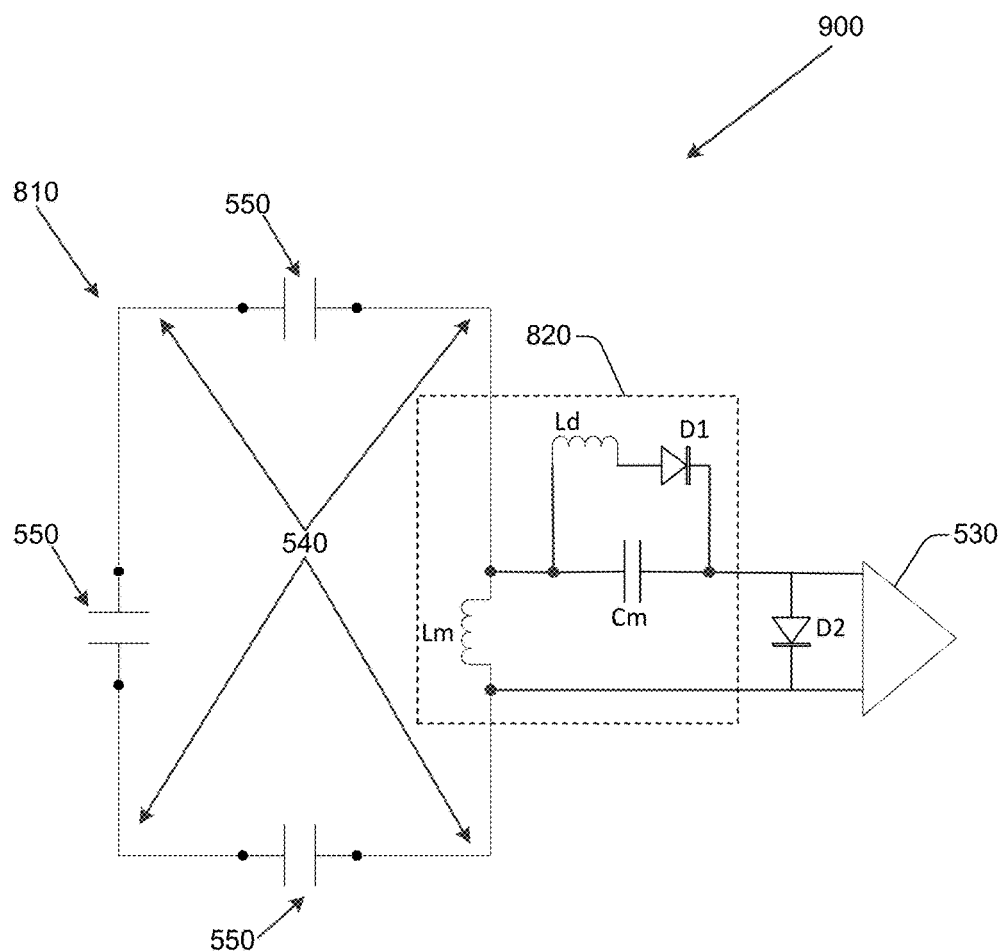
FIG. 9 illustrates an example single-layer MRI RF coil.

FIG. 9 illustrates an MRI RF coil element 900. MRI RF coil element 900 is similar to MRI RF coil element 800, but includes additional elements and details. MRI RF coil element 900 may be part of a single-layer MRI RF coil array. The single-layer MRI RF coil array comprises at least one RF coil element 900. MRI RF coil element 900 includes shunt diode D2. Shunt diode D2 has a first terminal and second terminal. Shunt diode D2 is connected, at a first terminal, to a first input terminal of preamplifier 530. Shunt diode D2 is connected, at a second terminal, to a second input terminal of preamplifier 530. To further improve isolation between high current induced in LC coil 510 and LNA preamplifier 530, shunt diode D2 provides additional shunt protection.

Embodiments described herein may include single-layer MRI RF coil arrays configured in shapes other than the cylindrical shape described above. For example, other shapes, including elliptical, rectangular, square, or other different shapes, may be used to build an Rx coil or single-layer MRI RF coil array for particular applications. For those shapes the concepts of the cylindrical case describe above are still applicable. Non-cylindrical shaped single-layer MRI RF coils may differ from cylindrical single-layer MRI RF coils in that the induced $B_1$ field of the other, non-cylindrical shapes is not as uniform as the induced $B_1$ field of the cylindrical case, but is still more than uniform enough for a Tx field in a clinical environment. The non-cylindrical shapes or cross sections discussed above are enclosed shapes or closed-shape configurations. Other embodiments are not only applicable to an enclosed shape but may also be implemented as opened shapes, including MRI RF coil elements arranged on two parallel planes, on two planes that are within a threshold of parallel, or MRI RF coil elements arranged in an enclosed shape with a side not present, for example, a "C" shape or a "U" shape.

One embodiment of a single-layer MRI RF coil array that employs an opened shape includes a plurality of loops, saddles, or other MRI RF coil elements arranged on two parallel planes, or on non-parallel planes that are within a threshold tolerance of being parallel to each other, located at least a threshold distance apart, and that face each other directly. A threshold tolerance of being parallel may be, for example, a 1% tolerance, a 10% tolerance, or other, different tolerance. For example, a first point on a first MRI RF coil element may be located 20 cm from a corresponding first point on a facing, second MRI RF coil element, while a second point on the first MRI RF coil element may be located 22 cm from a corresponding second point on the second MRI RF coil element. In this embodiment, the size of the loops may be identical, or may be within a threshold margin of difference. For example, a first loop may describe an area of x cm$^2$, while a second loop may describe an area of 0.9x cm$^2$. In one embodiment, a plurality of different sized loops may be located on a first plane, while a second plurality of different sized loops may be located on a second, parallel plane, or on a second plane that is within a threshold tolerance of being parallel with the first plane.

Figure 10:
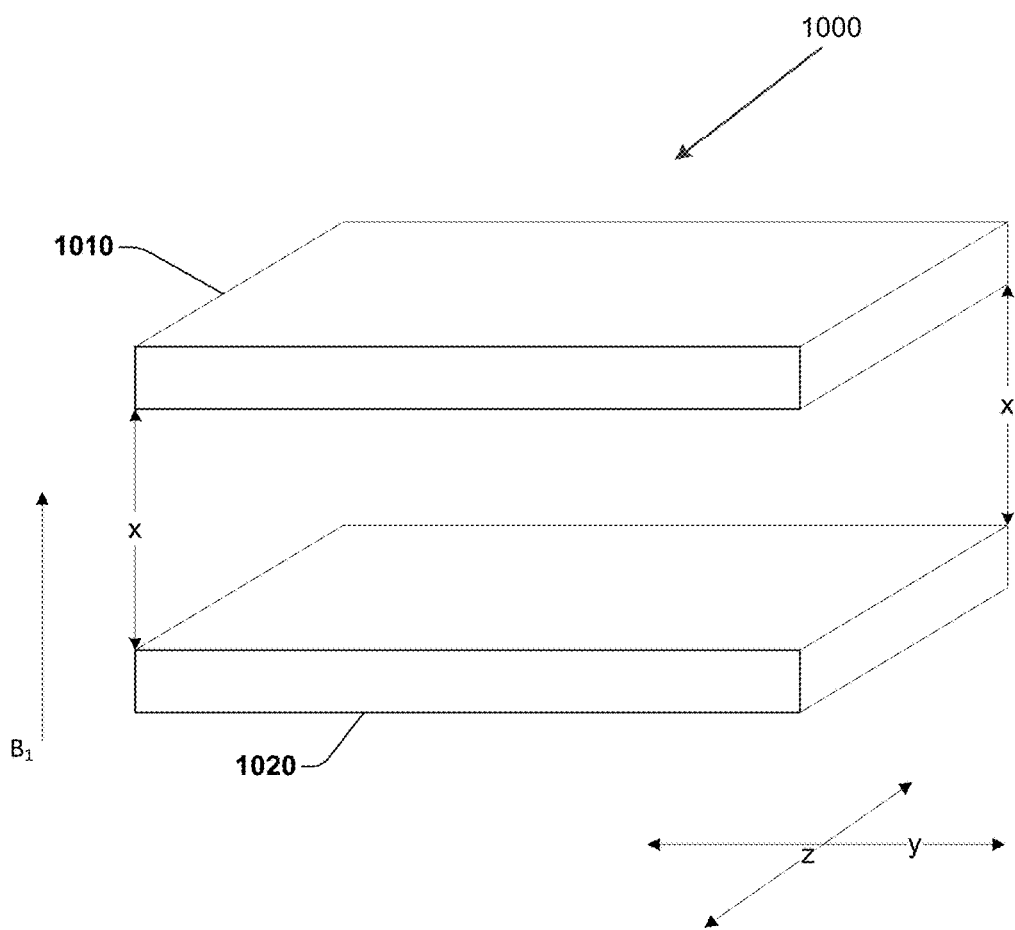
FIG. 10 illustrates an example open shape configuration MRI RF array.

FIG. 10 illustrates one embodiment of a single layer MRI RF coil array 1000 that includes at least two RF coil elements. While in this embodiment, only two RF coil loops are illustrated, in another embodiment, other, different numbers of RF coil loops may be employed. The at least two RF coil elements includes a first RF coil element 1010 and a second RF coil element 1020. First RF coil element 1010 and second RF coil element 1020 may include a single layer MRI RF coil element, including MRI RF coil element 500, 600, 700, 800, 900, or 1400. First RF coil element 1010 is arranged on a first plane, while second RF coil element 1020 is arranged on a second, different plane parallel to the first plane. FIG. 10 illustrates an example open shape configuration. The first plane and the second plane may be parallel to each other, and are located at least a threshold distance from each other. The threshold distance is a distance greater than zero. In this example, the at least a threshold distance is indicated by "x" in FIG. 10. The first plane and the second plane may, in another embodiment, be within threshold of parallel from each other. The first RF coil element 1010 and the second RF coil element 1020 may be offset laterally from each other a distance greater than zero, or may be directly aligned. For example, the first RF coil element 1010 and second RF coil element 1020 may be located 30 cm from each other in the x axis, and laterally offset 3 cm in the y axis or z axis. In other embodiments, other offsets may be employed.

First RF coil element 1010 and second RF coil element 1020 inductively couple to each other since they face each other. If both first RF coil element 1010 and second RF coil element 1020 are tuned independently to the same frequency without the presence of the other coil, their resonant frequency will split into two frequencies: a lower frequency and a higher frequency. The lower frequency is for the current of both RF coil element 1010 and RF coil element 1020 flowing in the same direction. The higher frequency is for the current of both RF coil element 1010 and RF coil element 1020 flowing in opposite directions. The frequencies may be written as $$f = \frac{1}{2\pi\sqrt{(L \pm M)C}},$$

where L is the inductance of the coil, C is the capacitance, and M is the mutual inductance between RF coil element 1010 and RF coil element 1020.

When both first RF coil element 1010 and second RF coil element 1020 are placed inside a WBC and the WBC generates a circular polarized (CP) uniform or a uniform $B_1$ field perpendicular to the planes of the coils, then the current induced in one of first RF coil element 1010 or second RF coil element 1020 by the WBC directly may be expressed as $$i_{1\_WBC} = \frac{\omega_0 A * B_1}{R} \quad \text{(Eq. 15)}$$

where A is the area of the loop, $B_1$ is the magnitude of WBC field, and R is the coil loss. In an example embodiment in which first RF coil element 1010 or second RF coil element 1020 includes RF coil element 500, 600, 700, 800, 900, or 1400, then the area A of the loop corresponds to the area of LC coil 510. Here, R is the only term in the denominator of Eq. 15 because $$j\omega_0 L - j\frac{1}{\omega_0 C} = 0$$

at the resonant frequency $\omega_0$. The same current is also true for the other coil. For clarity, herein only the $B_1$ field perpendicular to the first plane and second plane is described. However, a $B_1$ field that is not perpendicular to the first plane and second plane may be described similarly. This is shown in equation 16 below.

$$i_{2\_WBC} = \frac{\omega_0 A * B_1}{R} \quad \text{(Eq. 16)}$$

Recall that both currents are flowing in the same direction. Because there is mutual inductance between first RF coil element 1010 and second RF coil element 1020, the final current $i_1$ of the first RF coil element 1010 includes the additional current caused by mutual inductance coupling. The final currents $i_1$ and $i_2$ can be written as:

$$i_1 = \frac{\omega_0 A * B_1}{R} - \frac{M\frac{d(i_{2_{WBC}})}{dt}}{R} = \frac{\omega_0 A * B_1}{R} - M\frac{j(\omega_0^2 A * B_1)}{R^2} \quad \text{(Eq. 17)}$$

$$i_2 = \frac{\omega_0 A * B_1}{R} - \frac{M\frac{d(i_{1_{WBC}})}{dt}}{R} = \frac{\omega_0 A * B_1}{R} - M\frac{j(\omega_0^2 A * B_1)}{R^2} \quad \text{(Eq. 18)}$$

Both $i_1$ and $i_2$ flow in the same direction and have the same current magnitude. In this example, the coupling or mutual inductance between the first loop or first RF coil element 1010 and the second loop or second RF coil element 1020 causes a Tx efficiency loss. Thus, the sign before M in equation 17 and equation 18 is "−". This embodiment thus may function as the equivalent a two-turn solenoid or a saddle coil which generates a transmitting field that has a uniformity suitable for clinical use. In another embodiment, other, different configurations of coils may be employed.

In one embodiment of single-layer MRI RF coil array 1000, a member of the at least two RF coil elements (e.g. first RF coil element 1010, second RF coil element 1020) includes an LC coil, a matching and Tx/Rx switch circuit, and a preamplifier. In this embodiment, the LC coil includes at least one inductor and at least one capacitor. The at least one inductor and the at least one capacitor resonate at a first frequency. The LC coil is connected with the matching and transmit Tx/Rx switch circuit. The matching and transmit Tx/Rx switch circuit is connected to the preamplifier. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. For example, the magnitude or phase of the induced current may be variable over a range of magnitudes or phases respectively, by varying the coil loss resistance of the primary coil, the coil loss resistance of first RF coil element 1010 or second RF coil element 1020, or the difference between the working frequency of the primary coil and the resonant frequency of first RF coil element 1010 or second RF coil element 1020. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Figure 11:
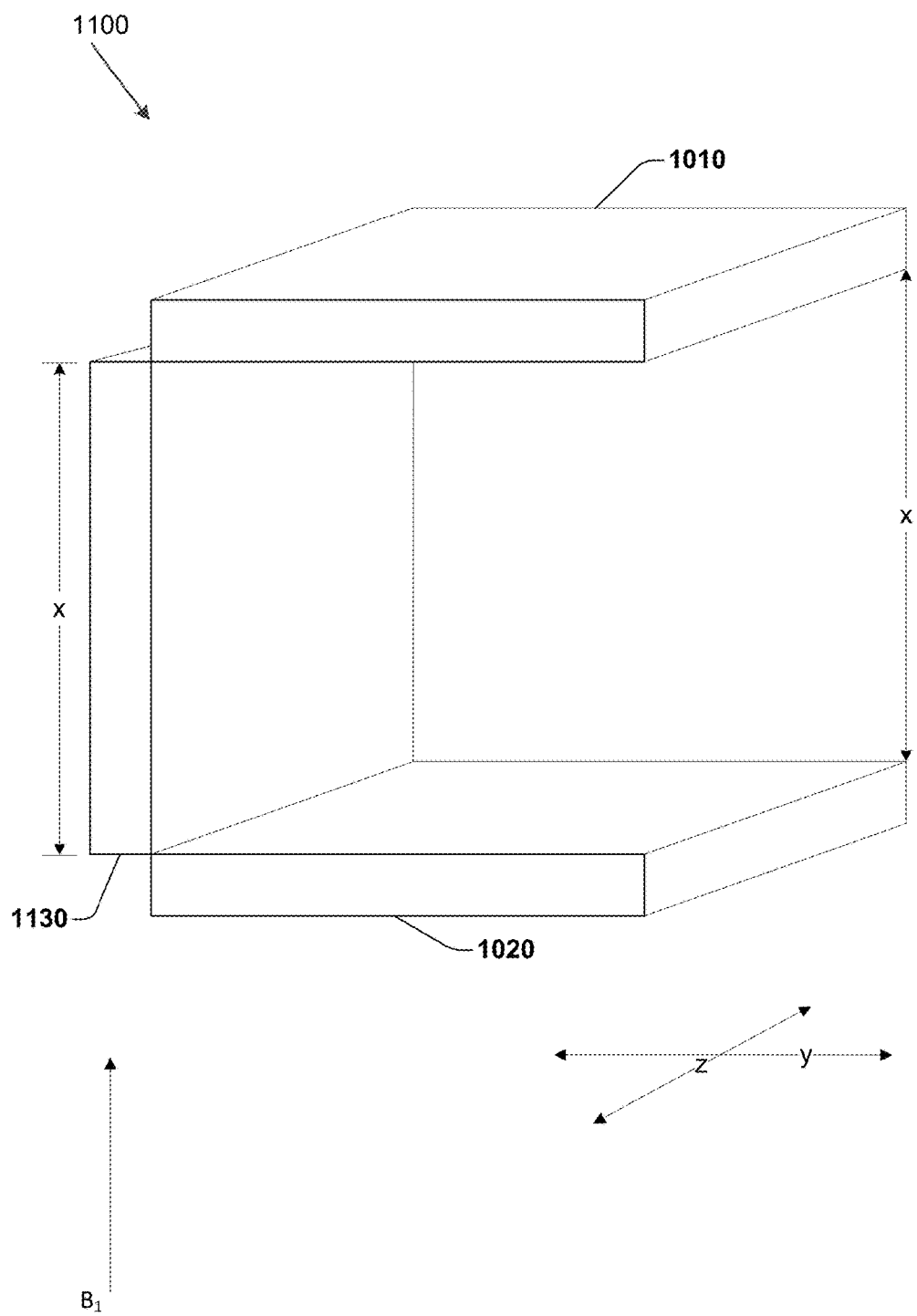
FIG. 11 illustrates an example open shape configuration MRI RF array.

FIG. 11 illustrates a single-layer MRI RF coil array 1100 that is similar to single-layer MRI RF coil array 1000 but that includes additional details and elements. Single-layer MRI RF coil array 1100 includes first RF coil element 1010, second RF coil element 1020, and also includes a third RF coil element 1130. FIG. 11 illustrates first RF coil element 1010, second RF coil element 1020, and third RF coil element 1130 disposed in an open shape configuration. In this embodiment, the RF coil elements 1010, 1020, and 1130 of MRI RF coil array 1100 are arranged approximately in the shape of a "C" or "U". First loop or RF coil element 1010 is arranged on a first plane, while second loop or RF coil element 1020 is arranged on a second, different plane. The first plane and the second plane may be parallel or slightly non-parallel to each other, and are located at least a threshold distance from each other. The threshold distance is a non-zero distance greater than zero. In this example, the at least a threshold distance is indicated by "x" in FIG. 11. In one embodiment, third RF coil element 1130 is arranged on a third plane that is perpendicular to the first plane and the second plane. In another embodiment, third RF coil element 1130 is arranged on a third plane that is within a threshold degree of parallel with the first plane or the second plane. For example, in one embodiment configured for a first anatomy to be imaged, the third RF coil element 1130 is arranged on a third plane that is perpendicular with the first plane and the second plane. In another embodiment configured for a second, different anatomy, the third RF coil element 1130 is arranged on a third plane that is not perpendicular with the first plane and the second plane. In one embodiment, an angle formed by the intersection of the third plane with the first plane or the second plane is user adjustable.

In one embodiment, third RF coil element 1130 is offset from the first RF coil element 1010 or the second RF coil element 1020 a non-zero amount along a y axis or a z axis. For example, the first RF coil element 1010 and second RF coil element 1020 may be located 30 cm from each other in the x axis, and laterally offset 3 cm in the y axis. The third RF coil element 1130 may be laterally offset 2 cm in the z axis from the first RF coil element 1010 and the second RF coil element 1020. In other embodiments, other offsets may be employed.

Third RF coil element 1130, like first RF coil element 1010 and second RF coil element 1020, may include an MRI RF coil element, including MRI RF coil element 500, 600, 700, 800, 900, or 1400. While three RF coil elements are illustrated, in another embodiment, other, different numbers of RF coil elements may be employed.

In one embodiment of single-layer MRI RF array coil 1100, a member of the at least three RF coil elements (e.g. first RF coil element 1010, second RF coil element 1020, third RF coil element 1130) includes an LC coil, a matching and transmit (Tx)/receive (Rx) switch circuit, and a preamplifier. In this embodiment, the LC coil includes at least one inductor and at least one capacitor. The at least one inductor and the at least one capacitor resonate at a first frequency. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Embodiments described herein may also be described using a mode approach. For example, two identical coils facing each other may both resonate at the same frequency if the other coil does not exist. Due to mutual inductance the two coils create two intrinsic resonant modes. The first mode is the lower frequency mode which is called saddle mode or corotation mode, where both coils' currents flow in the same direction. The other mode has a higher frequency and is called anti-saddle mode or counter-rotation mode in which the currents of the coils flow in opposite directions. If a uniform external field or a circular polarized uniform external field is applied to the coils, only the saddle mode configuration will have induced voltage because its net flux is non-zero while the anti-saddle mode's net flux is zero. As a result two identical coils facing each other will generate an amplified B1 field by the local saddle mode which has a level of uniformity suitable for clinical use. The external uniform field serves as a selector for modes. The larger the net magnetic flux the mode has, the more energy from the external field is coupled.

This discussion can also be extended to embodiments that employ a plurality of MRI RF coil elements. For example, in an embodiment with N coil elements in which some or all of the N coil elements' isolations may not be good, the N coil elements will couple to each other and create M Eigen-resonant modes in which a mode is a sum of some or all coil elements with different weighting coefficients and phases, where N and M are integers. In this embodiment, a mode is excited proportionally by the net magnetic flux of each mode from the WBC. The most uniform mode among all modes has the largest net magnetic flux from the WBC. For example, a two-element embodiment will be more uniform among modes. Therefore, the most uniform mode among the modes is the strongest mode excited by the WBC. If other less uniform modes' net magnetic fluxes from the WBC are not zero, they will be also excited but the induced fields from them are weaker than the most uniform mode, on average. The other less uniform modes make the final combined induced field more uniform than the induced field from the most uniform mode only. Thus, the final combined induced field is sufficiently uniform for use in clinical MRI applications.

In summary, a plurality of Rx coils or MRI RF coil elements configured as a single-layer MRI RF coil array, resonating with a WBC coil in Tx mode will induce a local amplified Tx field. The local amplified Tx field has a threshold level of uniformity and is used as a transmitter coil. This amplified Tx field improves the WBC power efficiency and reduces the SAR compared to conventional approaches because non-related anatomy areas will not experience a high Tx field from the WBC. In one embodiment, MRI RF array coils that connect to an MRI system can be connected through cables or may be connected wirelessly with no cables.

Example methods, coil arrays, coils, apparatus, or other embodiments may be employed for imaging different anatomical locations using the single-layer approach described herein. Example embodiments provide a universal approach to amplifying a WBC Tx field. For example, embodiments described herein may be used to image head anatomy as a head coil. Example embodiments may also be used for head and neck or neurovascular imaging as a head/neck coil. Example embodiments may be used for shoulder imaging as a shoulder coil, for cardiac applications as a cardiac coil, for hand/wrist imaging as a hand/wrist coil, for breast imaging as a breast coil, for torso imaging as a torso coil, for knee or foot imaging as a knee, foot, or knee/foot coil. Example embodiments may be used to image other regions of interest using other types of coil that employ single layer approaches described herein.

Figure 12:
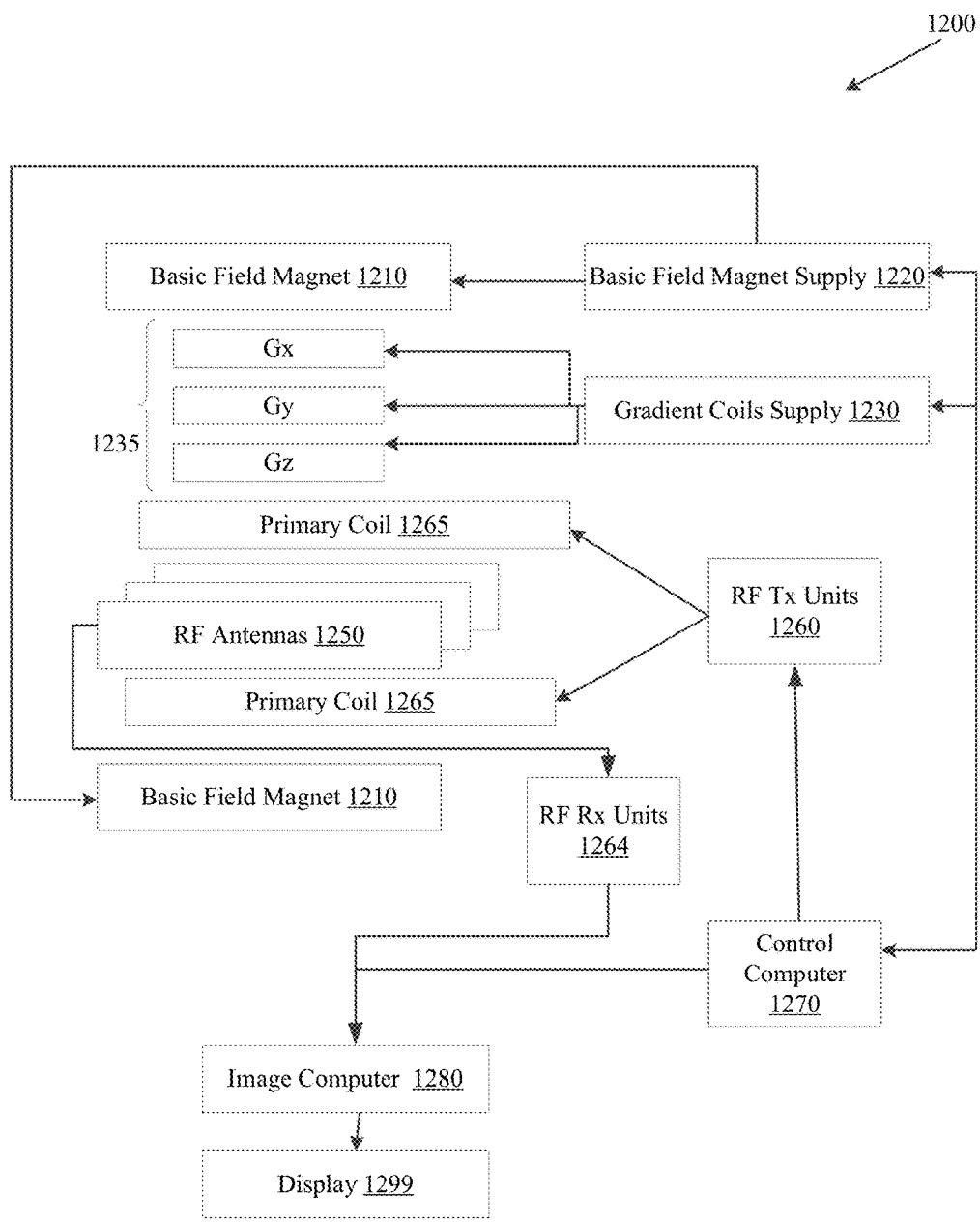
FIG. 12 illustrates an example MRI system.

FIG. 12 illustrates an example MRI apparatus 1200 configured with a set of example single-layer MRI RF coils. The apparatus 1200 includes a basic field magnet(s) 1210 and a basic field magnet supply 1220. Ideally, the basic field magnets 1210 would produce a uniform BO field. However, in practice, the BO field may not be uniform, and may vary over an object being imaged by the MRI apparatus 1200. MRI apparatus 1200 may include gradient coils 1235 configured to emit gradient magnetic fields like $G_x$, $G_y$, and $G_z$. The gradient coils 1235 may be controlled, at least in part, by a gradient coils supply 1230. In some examples, the timing, strength, and orientation of the gradient magnetic fields may be controlled, and thus selectively adapted during an MRI procedure.

MRI apparatus 1200 may include a primary coil 1265 configured to generate RF pulses. The primary coil 1265 may be a whole body coil. The primary coil 1265 may be, for example, a birdcage coil. The primary coil 1265 may be controlled, at least in part, by an RF transmission unit 1260. RF transmission unit 1260 may provide a signal to primary coil 1265.

MRI apparatus 1200 may include a set of RF antennas 1250 that are configured to inductively couple with primary coil 1265 and generate RF pulses and to receive resulting magnetic resonance signals from an object to which the RF pulses are directed. In one embodiment, a member of the set of RF antennas 1250 may be fabricated from flexible coaxial cable. The set of RF antennas 1250 may be connected with an RF receive unit 1264.

The gradient coils supply 1230 and the RF transmission units 1260 may be controlled, at least in part, by a control computer 1270. The magnetic resonance signals received from the set of RF antennas 1250 can be employed to generate an image, and thus may be subject to a transformation process like a two dimensional fast Fourier transform (FFT) that generates pixilated image data. The transformation can be performed by an image computer 1280 or other similar processing device. The image data may then be shown on a display 1299. RF Rx Units 1264 may be connected with control computer 1270 or image computer 1280. While FIG. 12 illustrates an example MRI apparatus 1200 that includes various components connected in various ways, it is to be appreciated that other MRI apparatus may include other components connected in other ways.

In one example, MRI apparatus 1200 may include control computer 1270. In one example, a member of the set of RF antennas 1250 may be individually controllable by the control computer 1270. A member of the set of RF antennas 1250 may be an example MRI RF coil element, or an example single-layer MRI RF coil array. For example, MRI RF coil element 500, 600, 700, 800, 900, or 1400 may be implemented as part of RF antennas 1250 illustrated in FIG. 12. In another embodiment, RF antennas 1250 may include single-layer MRI RF array 1010, or single-layer MRI RF array 1100. In another embodiment, the set of RF antennas 1250 may include other, different combinations of example embodiments of MRI RF coil elements or example embodiments of single-layer MRI RF coil arrays.

An MRI apparatus may include, among other components, a controller and an RF coil operably connected to the controller. The controller may provide the RF coil with a current, a voltage, or a control signal. The coil may be a whole body coil. The coil may inductively couple with an example MRI RF coil element or single-layer MRI coil array, as described herein, including MRI RF coil element 500, 600, 700, 800, 900, or 1400, or single-layer MRI coil array 1010 or single-layer MRI coil array 1110.

Circuits, apparatus, elements, MRI RF coils, arrays, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A single-layer magnetic resonance imaging (MRI) radio frequency (RF) coil array configured to operate in a transmit (Tx) mode or in a receive (Rx) mode, the MRI RF coil array comprising:

at least one RF coil elements, where each RF coil element of the at least one RF coil element includes:
   an LC coil of that RF coil element;
   a matching and transmit (Tx)/receive (Rx) switch circuit of that RF coil element; and
   a preamplifier of that RF coil element;
   where the LC coil of that RF coil element includes at least one inductor of that RF coil element and at least one capacitor of that RF coil element, where the at least one inductor of that RF coil element and the at least one capacitor of that RF coil element resonate at a first frequency;
   where the matching and Tx/Rx switch circuit of that RF coil element, when operating in Tx mode, electrically isolates the LC coil of that RF coil element from the preamplifier of that RF coil element upon the LC coil of that RF coil element resonating with a primary coil at a working frequency of the primary coil, where the LC coil of that RF coil element, upon resonating with the primary coil at the working frequency of the primary coil, generates a local amplified Tx field based on an induced current in the LC coil of that RF coil element, wherein the local amplified Tx field has a magnitude greater than that of a field of the primary coil throughout a local region that is smaller than a region in which the field of the primary coil is uniform, where a magnitude of the induced current of that RF coil element or a phase of the induced current of that RF coil element are configured to be varied over a range of magnitudes or phases respectively; and
   where the matching and Tx/Rx switch circuit of that RF coil element, when operating in Rx mode, electrically connects the LC coil of that RF coil element with the preamplifier of that RF coil element,
   wherein the primary coil is disabled during Rx mode.

2. The single-layer MRI RF coil array of claim 1, where the at least one RF coil element is arranged in a closed-shape configuration, or an open-shape configuration.

3. The single-layer MRI RF coil array of claim 1, where the at least one RF coil element is arranged in a single row birdcage configuration.

4. The single-layer MRI RF coil array of claim 1, where the MRI RF coil array comprises a first plurality of RF coil elements and a second plurality of RF coil elements, where the first plurality of RF coil elements and the second plurality of RF coil elements are radially disposed about a longitudinal axis, where the first plurality and the second plurality are longitudinally offset a threshold distance along the longitudinal axis, where the threshold distance is greater than zero.

5. The single-layer MRI RF coil of claim 4, where an element of the first plurality of RF coil elements is axially offset a threshold distance from a respective element of the second plurality of RF coil elements, where the threshold distance is greater than zero.

6. The single-layer MRI RF coil array of claim 4, where the first plurality includes at least four RF coil elements, and where the second plurality includes at least four RF coil elements.

7. The single-layer MRI RF coil array of claim 1, where the MRI RF coil array comprises a first plurality of RF coil elements, a second plurality of RF coil elements, and a third plurality of RF coil elements, where the first plurality of RF coil elements, the second plurality of RF coil elements, and the third plurality of RF coil elements are radially disposed about a longitudinal axis, and where the first plurality, the second plurality, and the third plurality are longitudinally offset a threshold distance along the longitudinal axis, where the threshold distance is greater than zero.

8. The single-layer MRI RF coil array of claim 7, where an element of the first plurality of RF coil elements is axially offset a threshold distance from a respective element of the second plurality of RF coil elements or the third plurality of RF coil elements, where the threshold distance is greater than zero.

9. The single-layer MRI RF coil array of claim 7, where the first plurality includes at least five RF coil elements, where the second plurality includes at least five RF coil elements, and where the third plurality includes at least five RF coil elements.

10. The single-layer MRI RF coil array of claim 1, where the primary coil is a whole body coil (WBC).

11. The single-layer MRI RF coil array of claim 1, where, for each RF coil element of the at least one RF coil element, the matching and Tx/Rx switch circuit of that RF coil element is a capacitive matching and Tx/Rx switch circuit.

12. The single-layer MRI RF coil array of claim 11, where, for each RF coil element of the at least one RF coil element, the matching and Tx/Rx circuit of that RF coil element comprises:
a matching capacitor of that RF coil element having a first terminal and a second terminal, wherein the matching capacitor of that RF coil element is different than the at least one capacitor of that RF coil element;
a first inductor of that RF coil element having a first terminal and a second terminal, wherein the first inductor of that RF coil element is different than the at least one inductor of that RF coil element;
a first capacitor of that RF coil element having a first terminal connected to the first terminal of the first inductor of that RF coil element, wherein the first capacitor of that RF coil element is different than the at least one capacitor of that RF coil element and the matching capacitor of that RF coil element; and
a first PIN diode of that RF coil element having a first terminal and a second terminal, the first terminal of the first PIN diode of that RF coil element connected to the second terminal of the first capacitor of that RF coil element, and the second terminal of the first PIN diode of that RF coil element connected to the second terminal of the first inductor of that RF coil element,
where the second terminal of the first inductor of that RF coil element is connected to a first input terminal of the preamplifier of that RF coil element, and where the second terminal of the matching capacitor of that RF coil element is connected to a second input terminal of the preamplifier of that RF coil element,
where the matching and Tx/Rx switch circuit of that RF coil element, upon application of a forward bias to the first PIN diode of that RF coil element, electrically isolates the preamplifier of that RF coil element from voltage induced in the LC coil of that RF coil element by mutual inductance with the primary coil.

13. The single-layer MRI RF coil array of claim 12, where, for each RF coil element of the at least one RF coil element, the matching and Tx/Rx switch circuit of that RF coil element further comprises:
a second capacitor of that RF coil element having a first terminal and a second terminal, wherein the second capacitor of that RF coil element is different than the at least one capacitor of that RF coil element, the first capacitor of that RF coil element, and the matching capacitor of that RF coil element;
a second inductor of that RF coil element having a first terminal and a second terminal, wherein the second inductor of that RF coil element is different than the at least one inductor of that RF coil element and the first inductor of that RF coil element;
and a second PIN diode of that RF coil element having a first terminal and a second terminal, wherein the second PIN diode of that RF coil element is different than the first PIN diode of that RF coil element, the first terminal of the second PIN diode of that RF coil element connected to the second terminal of the second capacitor of that RF coil element, and the second terminal of the second PIN diode of that RF coil element connected to the second terminal of the second inductor of that RF coil element,
where the second terminal of the second inductor of that RF coil element is connected to a second input terminal of the preamplifier of that RF coil element, and where the first terminal of the second capacitor of that RF coil element is connected to the first terminal of the second inductor of that RF coil element, where the first terminal of the second inductor of that RF coil element is connected to the second terminal of the matching capacitor of that RF coil element, and
where the matching and Tx/Rx switch circuit of that RF coil element, upon application of a forward bias to the first PIN diode of that RF coil element or the second PIN diode of that RF coil element, electrically isolates the preamplifier of that RF coil element from voltage induced in the LC coil of that RF coil element by mutual inductance with the primary coil.

14. The single-layer MRI RF coil array of claim 1, where, for each RF coil element of the at least one RF coil element, the matching and Tx/Rx switch circuit of that RF coil element is an inductive matching and Tx/Rx switch circuit.

15. The single-layer MRI RF coil array of claim 14, where, for each RF coil element of the at least one RF coil element, the matching and Tx/Rx switch circuit of that RF coil element comprises:
a matching capacitor of that RF coil element having a first terminal and a second terminal, wherein the matching capacitor of that RF coil element is different than the at least one capacitor of that RF coil element;
a matching inductor of that RF coil element having a first terminal and a second terminal, the first terminal of the matching inductor of that RF coil element connected to the first terminal of the matching capacitor of that RF coil element, wherein the matching inductor of that RF coil element is different than the at least one inductor of that RF coil element;
a first inductor of that RF coil element having a first terminal and second terminal, where the first terminal of the first inductor of that RF coil element is connected to the first terminal of the matching inductor of that RF coil element, wherein the first inductor of that RF coil element is different than the at least one inductor of that RF coil element and the matching inductor of that RF coil element;
a first PIN diode of that RF coil element having a first terminal and a second terminal, the first terminal of the first PIN diode of that RF coil element connected to the second terminal of the first inductor of that RF coil element, and the second terminal of the first PIN diode of that RF coil element connected to the second terminal of the matching capacitor of that RF coil element;
where the second terminal of the matching capacitor of that RF coil element is connected to a first input terminal of the preamplifier of that RF coil element, and where the second terminal of the matching inductor of that RF coil element is connected to a second input terminal of the preamplifier of that RF coil element, and
where the matching and Tx/Rx switch circuit of that RF coil element, upon application of a forward bias to the first PIN diode of that RF coil element, isolates the preamplifier of that RF coil element from voltage induced in the LC coil of that RF coil element by mutual inductance with the primary coil.

16. The single-layer MRI RF coil array of claim 1, where, for each RF coil element of the at least one RF coil element, the LC coil of that RF coil element includes at least one conductor of that RF coil element, where the at least one conductor of that RF coil element is a flexible co-axial cable.

17. The single-layer MRI RF coil array of claim 1, each RF coil element of the at least one RF coil element further comprising a shunt PIN diode of that RF coil element having a first terminal connected to a first input terminal of the preamplifier of that RF coil element, and a second terminal connected to a second input terminal of the preamplifier of that RF coil element, where, upon application of a forward bias to the shunt PIN diode of that RF coil element, the shunt PIN diode of that RF coil element provides shunt protection to the preamplifier of that RF coil element.

18. The single-layer MRI RF coil array of claim 1, where, for each RF coil element of the at least one RF coil element, the magnitude of the induced current of that RF coil element or a phase of the induced current of that RF coil element is a function of a coil loss resistance of the primary coil, a coil loss resistance of that RF coil element, or a difference between the working frequency of the primary coil and the first frequency.

19. A magnetic resonance imaging (MRI) radio frequency (RF) coil configured to operate in a transmit (Tx) mode or a receive (Rx) mode, where the MRI RF coil has a capacitance, the MRI RF coil comprising:
an LC circuit including:
a matching capacitor having a first terminal and a second terminal;
at least one conductor having a first end connected to the first terminal of the matching capacitor, and a second end connected to the second terminal of the matching capacitor;
a Tx/Rx switch including:
a first inductor having a first terminal and a second terminal;
a first capacitor having a first terminal connected to the first terminal of the inductor;
a first PIN diode having a first terminal and a second terminal, the first terminal of the PIN diode connected to the second terminal of the first capacitor, and the second terminal of the PIN diode connected to the second terminal of the first inductor; and
a preamplifier having a first input terminal connected to the second terminal of the first inductor, and a second input terminal connected to the second terminal of the matching capacitor,
where, upon application of a forward bias to the first PIN diode, the Tx/Rx switch isolates the preamplifier from voltage induced in the LC circuit by mutual inductance with a primary coil,
where the voltage induced in the LC circuit by mutual inductance with the primary coil induces a current within the LC circuit, where the induced current within the LC circuit generates a local amplified Tx field,
where a magnitude of the induced current or a phase of the induced current is independently adjustable, where the magnitude of the induced current or the phase of the induced current is configured to be varied over a range of magnitudes or phases respectively, and
where the induced current is a function of a coil loss resistance of the primary coil, a coil loss resistance of the MRI RF coil, or a difference between a working frequency of the primary coil and a resonant frequency of the MRI RF coil.

20. The MRI RF coil of claim 19, where the preamplifier is a low-noise amplifier (LNA).

21. The MRI RF coil of claim 19, further comprising:
a shunt PIN diode having a first terminal connected to the first input terminal of the preamplifier, and a second terminal connected to the second input terminal of the preamplifier, where, upon application of a forward bias to the shunt PIN diode, the shunt PIN diode provides shunt protection to the preamplifier.

22. A magnetic resonance imaging (MRI) radio frequency (RF) coil configured to operate in a transmit (Tx) mode or a receive (Rx) mode, where the MRI RF coil has a capacitance, the MRI RF coil comprising:
an LC circuit including:
a matching inductor having a first terminal and a second terminal;
at least one conductor having a first end connected to the first terminal of the matching inductor, and a second end connected to the second terminal of the matching inductor;
a Tx/Rx switch including:
an inductor having a first terminal and a second terminal;
a first capacitor having a first terminal connected to the first terminal of the inductor;

a first PIN diode having a first terminal and a second terminal, the first terminal of the PIN diode connected to the second terminal of the inductor, and the second terminal of the PIN diode connected to the second terminal of the first capacitor; and a preamplifier having a first input terminal connected to the second terminal of the first capacitor, and a second input terminal connected to the second terminal of the matching inductor, where, upon application of a forward bias to the first PIN diode, the Tx/Rx switch electrically isolates the preamplifier from a voltage induced in the LC circuit by mutual inductance with a primary coil, where the voltage induced in the LC circuit by mutual inductance with the primary coil induces a current within the LC circuit, where the induced current within the LC circuit generates a local amplified Tx field, where a magnitude of the induced current or a phase of the induced current is independently adjustable, where the magnitude of the induced current or the phase of the induced current is configured to be varied over a range of magnitudes or phases respectively, and where the induced current is a function of a coil loss resistance of the primary coil, a coil loss resistance of the MRI RF coil, or a difference between a working frequency of the primary coil and a resonant frequency of the MRI RF coil.

23. The MRI RF coil of claim 22, further comprising:
a shunt PIN diode having a first terminal connected to the first input terminal of the preamplifier, and a second terminal connected to the second input terminal of the preamplifier, where, upon application of a forward bias to the shunt PIN diode, the shunt PIN diode provides shunt protection to the preamplifier.

24. The MRI RF coil of claim 22, where the preamplifier is a low-noise amplifier (LNA).

25. A single-layer magnetic resonance imaging (MRI) radio frequency (RF) coil array configured to operate in a transmit (Tx) mode or in a receive (Rx) mode, the MRI RF coil array comprising at least two RF coil elements, where each member of the at least two RF coil elements includes:
an LC coil of that member;
a matching and transmit (Tx)/receive (Rx) switch circuit of that member connected to the LC coil of that member; and
a preamplifier of that member connected to the matching and Tx/Rx switch circuit of that member;
where the LC coil of that member includes at least one inductor of that member and at least one capacitor of that member, where the at least one inductor of that member and the at least one capacitor of that member resonate at a first frequency;
where the matching and Tx/Rx switch circuit of that member, when operating in Tx mode, electrically isolates the LC coil of that member from the preamplifier of that member upon the LC coil of that member resonating with a primary coil at the first frequency, where the LC coil of that member, upon resonating with the primary coil at the first frequency, generates, in combination with other members of the at least two RF coil elements, a local amplified Tx field based on an induced current in the LC coil of that member, wherein the local amplified Tx field has a magnitude greater than that of a field of the primary coil throughout a local region that is smaller than a region in which the field of the primary coil is uniform, where a magnitude of the induced current or a phase of the induced current is independently adjustable; and where the matching and Tx/Rx switch circuit of that member, when operating in Rx mode, electrically connects the LC coil of that member with the preamplifier of that member,
wherein the primary coil is disabled during Rx mode,
where the at least two RF coil elements are arranged on a first plane and a second plane, where a first member of the at least two RF coil elements is oriented in the first plane, and where a second member of the two RF coil elements is oriented in the second plane, where the first plane is parallel to the second plane or within a threshold of parallel to the second plane, and where the first plane is at least a threshold distance from the second plane, where the threshold distance is greater than zero.

26. The single-layer MRI RF coil array of claim 25, where, for each member of the at least two RF coil elements, the matching Tx/Rx circuit of that member is a capacitive matching Tx/Rx circuit.

27. The single-layer MRI RF coil array of claim 25, where, for each member of the at least two RF coil elements, the matching Tx/Rx circuit of that member is an inductive matching Tx/Rx circuit.

28. A single-layer magnetic resonance imaging (MRI) radio frequency (RF) coil array configured to operate in a transmit (Tx) mode or in a receive (Rx) mode, the MRI RF coil array comprising at least three RF coil elements, where each member of the at least three RF coil elements includes:
an LC coil of that member;
a matching and transmit (Tx)/receive (Rx) switch circuit of that member connected to the LC coil; and
a preamplifier of that member connected to the matching and transmit Tx/Rx switch circuit of that member;
where the LC coil of that member includes at least one inductor of that member and at least one capacitor of that member, where the at least one inductor of that member and the at least one capacitor of that member resonate at a first frequency;
where the matching and Tx/Rx switch circuit of that member, when operating in Tx mode, electrically isolates the LC coil of that member from the preamplifier of that member upon the LC coil of that member resonating with a primary coil at the first frequency, where the LC coil of that member, upon resonating with the primary coil at the first frequency, generates, in combination with other members of the at least three RF coil elements, a local amplified Tx field based on an induced current in the LC coil of that member, wherein the local amplified Tx field has a magnitude greater than that of a field of the primary coil throughout a local region that is smaller than a region in which the field of the primary coil is uniform, where a magnitude of the induced current or a phase of the induced current is configured to be varied over a range of magnitudes or phases respectively; and where the matching and Tx/Rx switch circuit of that member, when operating in Rx mode, electrically connects the LC coil of that member with the preamplifier of that member, wherein the primary coil is disabled during Rx mode, where a first member of the at least three RF coil elements is oriented in a first plane, where a second member of the at least three RF coil elements is oriented in a second plane parallel or within a threshold of parallel to the first plane, where the first plane is at least a first threshold distance from the second plane, where the first threshold distance is greater than zero, and where a third member of the at least three RF coil elements is oriented in a third plane perpendicular to, or within a threshold of perpendicular to, the first plane or the second plane, where the third member of the at least three RF coil elements is located at least a second threshold distance from a first edge of the first member of the at least three RF coil elements and from a corresponding first edge of the second member of the at least three RF coil elements.

29. The single-layer MRI RF coil array of claim 28, where, for each member of the at least three RF coil elements, the matching Tx/Rx circuit of that member is a capacitive matching Tx/Rx circuit.

30. The single-layer MRI RF coil array of claim 28, where, for each member of the at least two RF coil elements, the matching Tx/Rx circuit of that member is an inductive matching Tx/Rx circuit.

31. A magnetic resonance imaging (MRI) apparatus, comprising:
   a controller;
   a primary coil connected to the controller; and
   a single-layer MRI radio frequency (RF) coil array operably connected to the controller, where the MRI RF coil array includes at least one RF transmit (Tx)/receive (Rx) coil;
   where the controller provides the primary coil with a current, a voltage, or a control signal, and
   where each member of the at least one RF Tx/Rx coil comprises:
      an LC coil of that member;
         a matching and transmit (Tx)/receive (Rx) switch circuit of that member; and
         a preamplifier of that member;
            where the LC coil of that member includes at least one inductor of that member and at least one capacitor of that member, where the at least one inductor of that member and the at least one capacitor of that member resonate at a first frequency;
         where the matching and Tx/Rx switch circuit of that member, when operating in Tx mode, electrically isolates the LC coil of that member from the preamplifier of that member upon the LC coil of that member resonating with the primary coil at frequency working frequency of the primary coil, where the LC coil of that member, upon resonating with the primary coil at the working frequency of the primary coil, generates, in combination with other members of the at least three RF coil elements, a local amplified Tx field based on an induced current in the LC coil of that member, wherein the local amplified Tx field has a magnitude greater than that of a field of the primary coil throughout a local region that is smaller than a region in which the field of the primary coil is uniform, where a magnitude of the induced current or a phase of the induced current are configured to be varied over a range of magnitudes or phases respectively; and
         where the matching and Tx/Rx switch circuit of that member, when operating in Rx mode, electrically connects the LC coil of that member with the preamplifier of that member,
      wherein the primary coil is disabled during Rx mode.

32. The MRI apparatus of claim 31, where, for each member of the at least one Rx/Tx coil, the matching and Tx/Rx switch circuit of that member is a capacitive matching and Tx/Rx circuit, or an inductive matching and Tx/Rx circuit.

* * * * *